US012612553B2

(12) United States Patent
Sumi et al.

(10) Patent No.: US 12,612,553 B2
(45) **Date of Patent: *Apr. 28, 2026**

(54) OPTICALLY ANISOTROPIC LAYER, OPTICAL FILM, POLARIZING PLATE, AND IMAGE DISPLAY DEVICE

(71) Applicant: FUJIFILM Corporation, Tokyo (JP)

(72) Inventors: Toshikazu Sumi, Kanagawa (JP); Tatsuya Iwasaki, Kanagawa (JP); Shunya Katoh, Kanagawa (JP); Hiroshi Inada, Kanagawa (JP); Aiko Yamamoto, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 70 days.

This patent is subject to a terminal disclaimer.

(21) Appl. No.: 17/702,299

(22) Filed: Mar. 23, 2022

(65) Prior Publication Data

US 2022/0267675 A1 Aug. 25, 2022

Related U.S. Application Data

(63) Continuation of application No. PCT/JP2020/036154, filed on Sep. 25, 2020.

(30) Foreign Application Priority Data

Sep. 27, 2019 (JP) ................................ 2019-177857
Apr. 23, 2020 (JP) ................................ 2020-076638

(51) Int. Cl.

| | |
|---|---|
| ***G02F 1/1333*** | (2006.01) |
| ***C09K 19/04*** | (2006.01) |
| ***C09K 19/12*** | (2006.01) |
| ***C09K 19/20*** | (2006.01) |
| ***C09K 19/30*** | (2006.01) |
| ***C09K 19/54*** | (2006.01) |
| ***G02F 1/1335*** | (2006.01) |
| ***G02F 1/1337*** | (2006.01) |
| ***G02F 1/137*** | (2006.01) |
| *H10K 59/50* | (2023.01) |
| *H10K 59/80* | (2023.01) |

(52) U.S. Cl.

CPC ........ *C09K 19/542* (2013.01); *C09K 19/0403* (2013.01); *C09K 19/12* (2013.01); *C09K 19/2007* (2013.01); *C09K 19/3003* (2013.01); *C09K 19/3068* (2013.01); *G02F 1/133528* (2013.01); *G02F 1/133711* (2013.01); *G02F 1/133788* (2013.01); *G02F 1/13706* (2021.01); *C09K 2019/0414* (2013.01); *C09K 2019/122* (2013.01); *C09K 2019/3004* (2013.01); *C09K 2019/3075* (2013.01); *C09K 2019/3077* (2013.01); *C09K 2019/3083* (2013.01); *H10K 59/50* (2023.02); *H10K 59/8791* (2023.02)

(58) Field of Classification Search

CPC ............ C09K 19/3003; C09K 19/3804; C09K 19/0403; C09K 19/12; C09K 19/2007; C09K 19/3068; C09K 2019/0444; C09K 2019/0448; G02F 1/1333; G02F 1/133528; G02F 1/13706

See application file for complete search history.

(56) References Cited

U.S. PATENT DOCUMENTS

| | | | | |
|---|---|---|---|---|
| 6,466,297 | B1 | 10/2002 | Goulding et al. | |
| 10,473,820 | B2 * | 11/2019 | Yamamoto .......... | C09D 135/02 |
| 2013/0070899 | A1 | 3/2013 | Morishima et al. | |
| 2017/0174992 | A1 | 6/2017 | Ootsuki | |
| 2019/0219753 | A1 | 7/2019 | Kaneiwa et al. | |
| 2019/0264106 | A1 | 8/2019 | Takahashi et al. | |
| 2020/0079885 | A1 | 3/2020 | Tamura et al. | |
| 2020/0369959 | A1 | 11/2020 | Hayashi et al. | |
| 2020/0369960 | A1 | 11/2020 | Muramatsu et al. | |

(Continued)

FOREIGN PATENT DOCUMENTS

| | | | |
|---|---|---|---|
| CN | 102822704 | A | 12/2012 |
| CN | 110023347 | A | 7/2019 |

(Continued)

OTHER PUBLICATIONS

Office Action, issued by the State Intellectual Property Office of China on Dec. 21, 2022 in connection with Chinese Patent Application No. 202080067377.2.
Office Action, issued by the Japanese Patent Office on Mar. 22, 2023 in connection with Japanese Patent Application No. 2021-549011.
International Search Report issued in PCT/JP2020/036154 on Dec. 8, 2020.
Written Opinion issued in PCT/JP2020/036154 on Dec. 8, 2020.
International Preliminary Report on Patentability completed by WIPO on Mar. 15, 2022 in connection with International Patent Application No. PCT/JP2020/036154.
Office Action, issued by the Korean Intellectual Property Office on May 7, 2024 in connection with Korean Patent Application No. 10-2022-7009574.

*Primary Examiner* — Geraldina Visconti
(74) *Attorney, Agent, or Firm* — Edwards Neils LLC; Jean C. Edwards, Esq.

(57) ABSTRACT

An optical film, a polarizing plate, and an image display device, each having an optically anisotropic layer obtained by curing a polymerizable liquid crystal composition including a polymerizable liquid crystal compound (LCC) having forward wavelength dispersion and a monofunctional compound, and immobilizing an alignment state of the polymerizable LCC. The number $a_1$ of atoms of the polymerizable LCC and the number $a_2$ of atoms of the monofunctional compound satisfy a relationship of Expression (1): $0.2<a_2/a_1<0.55$; the number $b_1$ of the rings $B^1$ contained in the polymerizable LCC and the total number $b_2$ of the aromatic rings Ar and the rings $B^2$ contained in the monofunctional compound satisfy a relationship of Expression (2): $b_2=b_1\times0.5$ or $b_2=(b_1+1)\times0.5$.

21 Claims, 1 Drawing Sheet

(56) References Cited

U.S. PATENT DOCUMENTS

| | | | | |
|---|---|---|---|---|
| 2020/0369961 | A1 | 11/2020 | Muramatsu et al. | |
| 2020/0392408 | A1 | 12/2020 | Shibata et al. | |
| 2022/0213384 | A1* | 7/2022 | Katoh | H05B 33/02 |
| 2022/0213385 | A1* | 7/2022 | Hoshino | C09K 19/56 |
| 2022/0214484 | A1* | 7/2022 | Iwasaki | G02B 5/3016 |
| 2022/0220381 | A1* | 7/2022 | Nakamura | C08F 20/20 |
| 2022/0220382 | A1* | 7/2022 | Inada | G02B 5/3025 |
| 2022/0228064 | A1* | 7/2022 | Suzuki | H05B 33/02 |
| 2022/0267675 | A1* | 8/2022 | Sumi | C09K 19/2007 |
| 2023/0037751 | A1* | 2/2023 | Moriya | G09F 9/30 |

FOREIGN PATENT DOCUMENTS

| | | | |
|---|---|---|---|
| JP | 2017-125009 | A | 7/2017 |
| JP | 2019-049758 | A | 3/2019 |
| JP | 2019/133148 | A | 8/2019 |
| WO | 2018/062110 | A1 | 4/2018 |
| WO | 2018/216812 | A1 | 11/2018 |
| WO | 2019/160016 | A1 | 8/2019 |
| WO | 2019/160025 | A1 | 8/2019 |
| WO | 2019/160044 | A1 | 8/2019 |
| WO | 2019/167926 | A1 | 9/2019 |
| WO | 2019/172248 | A1 | 9/2019 |

* cited by examiner

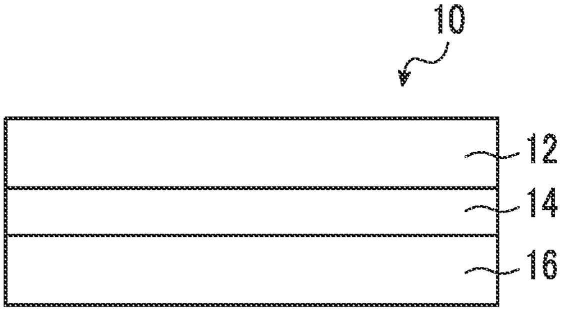
10
12
14
16

OPTICALLY ANISOTROPIC LAYER, OPTICAL FILM, POLARIZING PLATE, AND IMAGE DISPLAY DEVICE

CROSS-REFERENCE TO RELATED APPLICATIONS

This application is a Continuation of PCT International Application No. PCT/JP2020/036154 filed on Sep. 25, 2020, which claims priority under 35 U.S.C. § 119(a) to Japanese Patent Application No. 2019-177857 filed on Sep. 27, 2019 and Japanese Patent Application No. 2020-076638 filed on Apr. 23, 2020. Each of the above applications is hereby expressly incorporated by reference, in its entirety, into the present application.

BACKGROUND OF THE INVENTION

1. Field of the Invention

The present invention relates to an optically anisotropic layer, an optical film, a polarizing plate, and an image display device.

2. Description of the Related Art

Optical films such as an optical compensation sheet and a phase difference film are used in various image display devices in order to eliminate image coloration or expand a viewing angle.

A stretched birefringent film has been used as the optical film, but in recent years, it has been proposed to use an optical film having an optically anisotropic layer consisting of a liquid crystal compound instead of the stretched birefringent film.

As such an optically anisotropic layer, for example, a liquid crystal polymer film obtained by polymerization of a polymerizable liquid crystal composition containing a polymerizable liquid crystalline compound having a low wavelength dispersion characteristic having two polymerizable groups and a specific ring structure is described in JP2017-125009A (claims 1, 11, 13, and the like).

In addition, a polarizing layer formed from a composition containing a polymerizable smectic liquid crystal compound and a dichroic coloring agent is described in JP2019-049748A (claim 1 and the like).

SUMMARY OF THE INVENTION

The present inventors have conducted investigations on an optically anisotropic layer and an image display device having the optically anisotropic layer, based on JP2017-125009A and JP2019-049758A, and have thus found that there is room for improvement in the contrast of an image display device.

Therefore, an object of the present invention is to provide an optically anisotropic layer with which an image display device having an excellent contrast can be manufactured; and an optical film, a polarizing plate, and an image display device, each having the optically anisotropic layer.

The present inventors have conducted intensive investigations to accomplish the object, and as a result, they have found that by curing a polymerizable liquid crystal composition including a polymerizable liquid crystal compound having forward wavelength dispersion and a monofunctional compound, in which the polymerizable liquid crystal compound having forward wavelength dispersion and the monofunctional compound satisfy a predetermined relational expression with respect to the number of atoms and the number of rings, to form an optically anisotropic layer immobilized so that the alignment state of the polymerizable liquid crystal compound has a periodic structure, whereby the contrast of an image display device having the optically anisotropic layer is good, and thus, the present inventors have completed the present invention.

That is, the present inventors have found that the object can be accomplished by the following configurations.

[1] An optically anisotropic layer obtained by curing a polymerizable liquid crystal composition including a polymerizable liquid crystal compound having forward wavelength dispersion and a monofunctional compound, and immobilizing an alignment state of the polymerizable liquid crystal compound, in which the polymerizable liquid crystal compound has polymerizable groups $P^1$ and $P^2$ that constitute one terminal and the other terminal of the polymerizable liquid crystal compound, respectively, and three or more rings $B^1$ existing on a bond that links the polymerizable groups $P^1$ and $P^2$, and selected from the group consisting of an aromatic ring which may have a substituent and an alicyclic ring which may have a substituent, the monofunctional compound has a polymerizable group $P^3$ that is polymerizable with the polymerizable liquid crystal compound, an aromatic ring Ar which may have a substituent, and one or more rings $B^2$ existing on a bond that links the polymerizable group $P^3$ and the aromatic ring Ar, and selected from the group consisting of an aromatic ring which may have a substituent and an alicyclic ring which may have a substituent, in the monofunctional compound, the polymerizable group $P^3$ constitutes one terminal of the monofunctional compound, and the aromatic ring Ar or the substituent which may be contained in the aromatic ring Ar constitutes the other terminal of the monofunctional compound, the number $a_1$ of atoms of the polymerizable liquid crystal compound and the number $a_2$ of atoms of the monofunctional compound satisfy a relationship of Expression (1), the number $b_1$ of the rings $B^1$ contained in the polymerizable liquid crystal compound and a total number $b_2$ of the aromatic rings Ar and the ring $B^2$ contained in the monofunctional compound satisfy a relationship of Expression (2), and the optically anisotropic layer shows a diffraction peak derived from a periodic structure in X-ray diffraction measurement.

$$0.2<a_2/a_1<0.55 \quad \text{Expression (1):}$$

$$b_2=b_1\times0.5 \text{ or } b_2=(b_1+1)\times0.5 \quad \text{Expression (2):}$$

[2] The optically anisotropic layer as described in [1], in which an array of rings consisting of the ring $B^2$ and the aromatic ring Ar arranged in order from the polymerizable group $P^3$ in the monofunctional compound is the same as an array of the rings $B^1$ arranged from the polymerizable group $P^1$ or $P^2$ in the polymerizable liquid crystal compound.

[3] The optically anisotropic layer as described in [1] or [2], in which a structure of a portion W2 from the ring $B^2$ closest to the polymerizable group $P^3$ to the group closest to the aromatic ring Ar on the bond that links the polymerizable group $P^3$ of the monofunctional compound and the aromatic ring Ar is the same as a structure of a portion W1 from the ring $B^1$ closest to the polymerizable group $P^1$ or $P^2$ on the bond that links the polymerizable groups $P^1$ and $P^2$ of the polymerizable liquid crystal compound.

[4] The optically anisotropic layer as described in any one of [1] to [3], in which the polymerizable liquid crystal compound has five rings $B^1$.

[5] The optically anisotropic layer as described in any one of [1] to [4], in which the monofunctional compound has two rings $B^2$.

[6] The optically anisotropic layer as described in any one of [1] to [5], in which the polymerizable liquid crystal compound is a compound represented by Formula (I) which will be described later.

[7] The optically anisotropic layer as described in [6], in which the aromatic ring represented by $Ar^3$ in Formula (I) has the number of π electrons of 10 or more.

[8] The optically anisotropic layer as described in [6] or [7], in which $Ar^3$ in Formula (I) is a group represented by Formula (III) which will be described later.

[9] The optically anisotropic layer as described in any one of [6] to [8], in which all of n1, m1, m2, and n2 in Formula (I) are 1.

[10] The optically anisotropic layer as described in any one of [6] to [8], in which both of n1 and n2 in Formula (I) are 0, and both of m1 and m2 are 2.

[11] The optically anisotropic layer as described in any one of [1] to [9], in which the monofunctional compound is a compound represented by Formula (II) which will be described later.

[12] The optically anisotropic layer as described in any one of [1] to [11], in which the polymerizable liquid crystal compound has at least one 1,4-cyclohexylene group.

[13] The optically anisotropic layer as described in any one of [1] to [12], in which the monofunctional compound has at least one 1,4-cyclohexylene group.

[14] The optically anisotropic layer as described in any one of [1] to [13], in which the number $a_1$ of atoms of the polymerizable liquid crystal compound and the number $a_2$ of atoms of the monofunctional compound satisfy a relationship of Expression (1a).

$$0.35 < a_2/a_1 < 0.53 \quad \text{Expression (1a):}$$

[15] The optically anisotropic layer as described in any one of [1] to [14], in which the polymerizable liquid crystal compound is immobilized in a state of being horizontally aligned with respect to a main surface of the optically anisotropic layer.

[16] The optically anisotropic layer as described in any one of [1] to [15], in which the optically anisotropic layer is a positive A plate.

[17] An optical film comprising the optically anisotropic layer as described in any one of [1] to [16].

[18] The optical film as described in [17], in which the optically anisotropic layer is formed on a surface of a photo-alignment film.

[19] A polarizing plate comprising:

the optical film as described in [17] or [18]; and a polarizer.

[20] An image display device comprising the optical film as described in [17] or [18], or the polarizing plate as described in [19].

[21] The image display device as described in [20], in which the image display device is a liquid crystal display device.

[22] The image display device as described in [20], in which the image display device is an organic EL display device.

The present invention provides an optically anisotropic layer with which an image display device having an excellent contrast can be manufactured; and an optical film, a polarizing plate, and an image display device, each having the optically anisotropic layer.

BRIEF DESCRIPTION OF THE DRAWINGS

FIG. 1 is a schematic cross-sectional view showing an example of an optical film.

DESCRIPTION OF THE PREFERRED EMBODIMENTS

Hereinafter, the present invention will be described in detail.

Description of configuration requirements described below may be made on the basis of representative embodiments of the present invention in some cases, but the present invention is not limited to such embodiments.

Furthermore, in the present specification, a numerical value range expressed using "to" means a range that includes the preceding and succeeding numerical values of "to" as the lower limit value and the upper limit value, respectively.

In addition, in the present specification, only one kind of the substance corresponding to each component may be used alone or two or more kinds thereof may also be used in combination, for each component. Here, in a case where the two or more kinds of substances are used in combination for each component, the content of the component refers to a total content of the substances used in combination unless otherwise specified.

In addition, in the present specification, the bonding direction of a divalent group (for example, —CO—O—) as noted is not particularly limited unless the bonding position is specified, and for example, in a case where $X^1$ in Formula (I) which will be described later is —CO—O—, $X^1$ may be either *1-CO—O—*2 or *1-O—CO—*2, in which *1 represents a bonding position to the $Sp^1$ side and *2 represents a bonding position to the $Ar^1$ side.

[Optically Anisotropic Layer]

The optically anisotropic layer of the embodiment of the present invention is an optically anisotropic layer formed by curing a polymerizable liquid crystal composition (also simply referred to as "the present composition") including a polymerizable liquid crystal compound having forward wavelength dispersion (hereinafter also simply referred to as a "polymerizable liquid crystal compound") and a monofunctional compound, and immobilizing the alignment state of the polymerizable liquid crystal compound.

In addition, in the present invention, the polymerizable liquid crystal compound has polymerizable groups $P^1$ and $P^2$ that constitute one terminal and the other terminal of the polymerizable liquid crystal compound, respectively, and three or more rings $B^1$ existing on a bond that links the polymerizable groups $P^1$ and $P^2$, and selected from the group consisting of an aromatic ring which may have a substituent and an alicyclic ring which may have a substituent.

Furthermore, in the present invention, the monofunctional compound has a polymerizable group $P^3$ that is polymerizable with the polymerizable liquid crystal compound, an aromatic ring Ar which may have a substituent, and one or more rings $B^2$ existing on a bond that links the polymerizable group $P^3$ and the aromatic ring Ar, and selected from the group consisting of an aromatic ring and an alicyclic ring.

Moreover, in the monofunctional compound, the polymerizable group $P^3$ constitutes one terminal of the monofunctional compound, and the aromatic ring Ar or the substituent which may be contained in the aromatic ring Ar constitutes the other terminal of the monofunctional compound.

Furthermore, in the present invention, the number $a_1$ of atoms of the polymerizable liquid crystal compound and the number $a_2$ of atoms of the monofunctional compound satisfy a relationship of Expression (1).

$$0.2<a_2/a_1<0.55 \qquad \text{Expression (1):}$$

The number $a_1$ of atoms of the polymerizable liquid crystal compound represents the number of atoms on a bond that links one terminal and the other terminal of the polymerizable liquid crystal compound at the shortest distance, and hydrogen atoms are not included.

In addition, the number $a_2$ of atoms of the monofunctional compound represents the number of atoms on a bond that links one terminal and the other terminal of the monofunctional compound at the shortest distance, and hydrogen atoms are not included.

The one terminal and the other terminal of the compound mean a starting atom and an ending atom, respectively, for which a maximum number of atoms is calculated in a case where the atoms on the bond of the compound are linked at the shortest distance.

Incidentally, in a case where the number of atoms on the bond is counted, the atoms which are at the starting point and the ending point are also counted.

Therefore, one and the other of the atoms which are at the starting point and the ending point in the calculation of the number $a_1$ of atoms of the polymerizable liquid crystal compound are included in the polymerizable group $P^1$ and the polymerizable group $P^2$, respectively. In addition, one and the other of the atoms which are at the starting point and the ending point in the calculation of the number $a_2$ of atoms of the monofunctional compound are included in the polymerizable group $P_3$ of the monofunctional compound and either the aromatic ring Ar which may have a substituent or the substituent.

For example, the number $a_1$ of atoms of the following polymerizable liquid crystal compound L-1 which is an example of the polymerizable liquid crystal compound is "44", the number $a_2$ of atoms of the following monofunctional compound M-1 which is an example of the monofunctional compound is "22", and "a2/a1" is thus calculated as 0.500, and therefore, the polymerizable liquid crystal compound L-1 and the monofunctional compound M-1 satisfy a relationship of Expression (1).

L-1

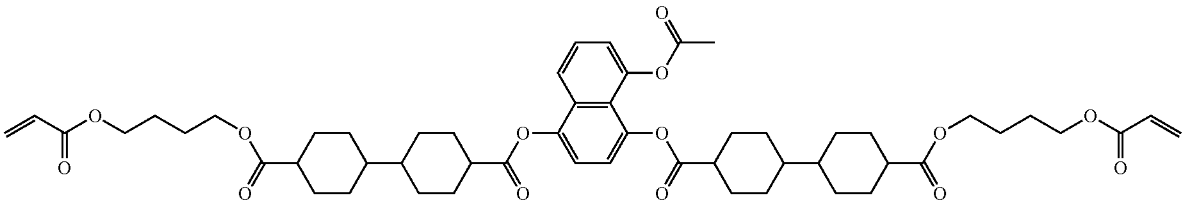

M-1

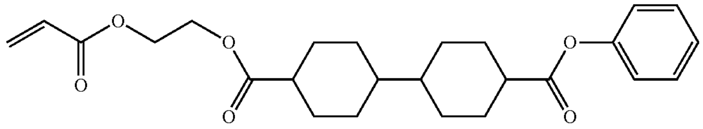

Moreover, in the present invention, the number $b_1$ of the rings $B^1$ contained in the polymerizable liquid crystal compound and a total number $b_2$ of the rings $B^2$ and the rings Ar contained in the monofunctional compound satisfy a relationship of Expression (2).

$$b_2=b_1\times 0.5 \text{ or } b_2=(b_1+1)\times 0.5 \qquad \text{Expression (2):}$$

For example, since the number of the rings $B^1$ contained in the polymerizable liquid crystal compound L-1 is "5" and the total number of the rings $B^2$ and the rings Ar of the monofunctional compound M-1 is "3", the polymerizable liquid crystal compound R3 and the monofunctional compound A1 satisfy a relationship of Expression (2).

Furthermore, the optically anisotropic layer of the embodiment of the present invention shows a diffraction peak derived from a periodic structure in X-ray diffraction measurement.

Incidentally, in a case where the present composition includes two or more kinds of polymerizable liquid crystal compounds and/or includes two or more kinds of monofunctional compounds, at least one polymerizable liquid crystal compound and at least one monofunctional compound only need to satisfy a relationship of Expressions (1) and (2).

In the present invention, by forming an optically anisotropic layer having a periodic structure, using a polymerizable liquid crystal composition in which the number $a_1$ of atoms of the polymerizable liquid crystal compound and the number $a_2$ of atoms of the monofunctional compound satisfy the relationship of Expression (1), and the number $b_1$ of the rings $B^1$ contained in the polymerizable liquid crystal compound and the total number $b_2$ of the rings $B^2$ and the aromatic rings Ar contained in the monofunctional compound satisfy the relationship of Expression (2), the contrast of an image display device having the optically anisotropic layer is good.

A reason therefor is not specifically clear, but is presumed to be as follows by the present inventors.

That is, it is considered that by satisfying the relationship of Expressions (1) and (2), the monofunctional compound enters between the molecules of the polymerizable liquid crystal compound and the alignment defects due to curing shrinkage upon immobilization of the alignment state are suppressed without disturbing the alignment state of the polymerizable liquid crystal compound, and as a result, the contrast of an image display device having the optically anisotropic layer is good.

In the polymerizable liquid crystal compound and the monofunctional compound included in the present composition, from the viewpoint that the optically anisotropic layer easily expresses a liquid crystal phase having a periodic structure and the generation of defects in the optically anisotropic layer can be further suppressed, it is preferable that the number $a_1$ of atoms of the polymerizable liquid crystal compound and the number $a_2$ of atoms of the monofunctional compound satisfy a relationship of Expression (1a).

$$0.35<a_2/a_1<0.53 \qquad \text{Expression (1a):}$$

[Polymerizable Liquid Crystal Composition]

The present composition includes at least a polymerizable liquid crystal compound and a monofunctional compound, which satisfy the relationships of Expression (1) and Expression (2).

Hereinafter, the respective components of the present composition will be described in detail.

<Polymerizable Liquid Crystal Compound>

The polymerizable liquid crystal compound included in the present composition is not particularly limited as long as it is a polymerizable liquid crystal compound having forward wavelength dispersion and having two polymerizable groups $P^1$ and $P^2$, and three or more rings $B^1$ existing on a bond that links the polymerizable groups $P^1$ and $P^2$, and selected from the group consisting of an aromatic ring and an alicyclic ring.

Incidentally, the two polymerizable groups $P^1$ and $P^2$ of the polymerizable liquid crystal compound may be the same as or different from each other, and the three or more rings $B^1$ of the polymerizable liquid crystal compound may be the same as or different from each other.

In addition, the polymerizable liquid crystal compound has forward wavelength dispersion.

The expression, “having forward wavelength dispersion” in the present specification means that in a case where an in-plane retardation (Re) value at a specific wavelength (visible light range) of a phase difference film manufactured using the liquid crystal compound is measured, the Re value is decreased as a measurement wavelength is increased.

The polymerizable groups $P^1$ and $P^2$ contained in the polymerizable liquid crystal compound are not particularly limited, but are each preferably a polymerizable group which is radically polymerizable or cationically polymerizable.

A known radically polymerizable group can be used as the radically polymerizable group, and suitable examples thereof include an acryloyloxy group or a methacryloyloxy group. In this case, it is known that the acryloyloxy group tends to have a higher polymerization rate, and from the viewpoint of improvement of productivity, the acryloyloxy group is preferable but the methacryloyloxy group can also be used as the polymerizable group.

A known cationically polymerizable group can be used as the cationically polymerizable group, and specific examples thereof include an alicyclic ether group, a cyclic acetal group, a cyclic lactone group, a cyclic thioether group, a spiroorthoester group, and a vinyloxy group. Among those, the alicyclic ether group or the vinyloxy group is preferable, and an epoxy group, an oxetanyl group, or the vinyloxy group is more preferable.

Particularly preferred examples of the polymerizable group include a polymerizable group represented by any of Formulae (P-1) to (P-20).

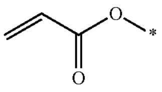
(P-1)

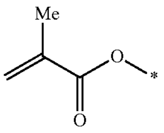
(P-2)

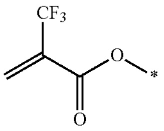
(P-3)

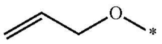
(P-4)

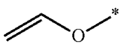
(P-5)

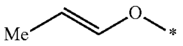
(P-6)

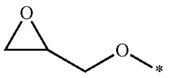
(P-7)

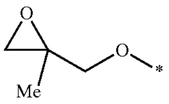
(P-8)

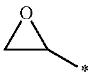
(P-9)

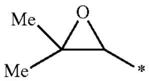
(P-10)

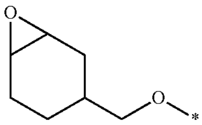
(P-11)

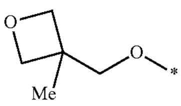
(P-12)

-continued (P-13)

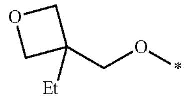

(P-14)

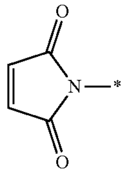

(P-15)

HS—*

(P-16)

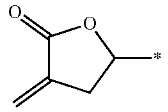

(P-17)

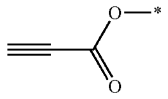

(P-18)

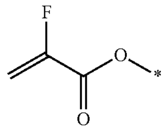

(P-19)

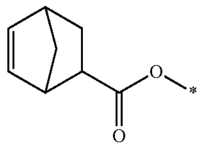

(P-20)

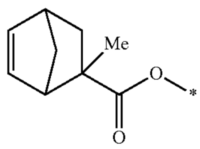

The polymerizable liquid crystal compound may have three or more polymerizable groups. In a case where the polymerizable liquid crystal compound has three or more polymerizable groups, the polymerizable group other than the above-mentioned polymerizable groups $P^1$ and $P^2$ is not particularly limited, and examples of the polymerizable group, including suitable aspects thereof, include the same ones as those of the polymerizable group which is radically polymerizable or cationically polymerizable.

The number of polymerizable groups contained in the polymerizable liquid crystal compound is preferably 2 to 4, and more preferably only two of the polymerizable groups $P^1$ and $P^2$ are contained.

The polymerizable liquid crystal compound has three or more rings $B^1$ existing on a bond that links the polymerizable groups $P^1$ and $P^2$, and selected from the group consisting of an aromatic ring which may have a substituent and an alicyclic ring which may have a substituent.

Here, the expression of the ring $B^1$ "which exists on a bond that links the polymerizable groups $P^1$ and $P^2$" means that the ring $B^1$ constitutes a part of a portion necessary for directly linking the polymerizable groups $P^1$ and $P^2$.

The polymerizable liquid crystal compound may have a portion other than the portion necessary for directly linking the polymerizable groups $P^1$ and $P^2$ (hereinafter also referred to as a "side chain"), but the ring structure constituting a part of the side chain is not included in the ring $B^1$.

Examples of the aromatic ring which may have a substituent, which is one aspect of the ring $B^1$, include an aromatic ring having 5 to 20 ring members, which may have a substituent.

Examples of the aromatic ring having 5 to 20 ring members include an aromatic hydrocarbon ring such as a benzene ring, a naphthalene ring, an anthracene ring, and a phenanthrene ring; and an aromatic heterocyclic ring such as a furan ring, a pyrrole ring, a thiophene ring, a pyridine ring, a thiazole ring, a benzothiazole ring, a quinoline ring, an isoquinoline ring, a quinoxaline ring, and a quinazoline ring.

Examples of the substituent which may be contained in the aromatic ring which is one aspect of the ring $B^1$ include an alkyl group, an alkoxy group, an alkylcarbonyl group, an alkoxycarbonyl group, an alkylcarbonyloxy group, an alkylamino group, a dialkylamino group, an alkylamide group, an alkenyl group, an alkynyl group, a halogen atom, a cyano group, a nitro group, an alkylthiol group, and an N-alkylcarbamate group.

Among those, the alkyl group, the alkoxy group, the alkoxycarbonyl group, the alkylcarbonyloxy group, or the halogen atom is preferable.

As the alkyl group, a linear, branched, or cyclic alkyl group having 1 to 18 carbon atoms is preferable, an alkyl group having 1 to 8 carbon atoms (for example, a methyl group, an ethyl group, a propyl group, an isopropyl group, an n-butyl group, an isobutyl group, a sec-butyl group, a t-butyl group, and a cyclohexyl group) is more preferable, an alkyl group having 1 to 4 carbon atoms is still more preferable, and the methyl group or the ethyl group is particularly preferable.

As the alkoxy group, an alkoxy group having 1 to 18 carbon atoms is preferable, an alkoxy group having 1 to 8 carbon atoms (for example, a methoxy group, an ethoxy group, an n-butoxy group, and a methoxyethoxy group) is more preferable, an alkoxy group having 1 to 4 carbon atoms is still more preferable, and the methoxy group or the ethoxy group is particularly preferable.

Examples of the alkoxycarbonyl group include a group in which an oxycarbonyl group (—O—CO— group) is bonded to the alkyl group exemplified above, and for example, the alkoxycarbonyl group is preferably a methoxycarbonyl group, an ethoxycarbonyl group, an n-propoxycarbonyl group, or an isopropoxycarbonyl group, and more preferably the methoxycarbonyl group.

Examples of the alkylcarbonyloxy group include a group in which a carbonyloxy group (—CO—O— group) is bonded to the alkyl group, and for example, a methylcarbonyloxy group, an ethylcarbonyloxy group, an n-propylcarbonyloxy group, or an isopropylcarbonyloxy group is preferable, and the methylcarbonyloxy group is more preferable.

Examples of the halogen atom include a fluorine atom, a chlorine atom, a bromine atom, and an iodine atom, and the fluorine atom or the chlorine atom is preferable. Examples of the alicyclic ring which may have a substituent, which is one aspect of the ring $B^1$, include a divalent alicyclic hydrocarbon group having 5 to 20 carbon atoms, which may have a substituent, and a heterocyclic ring in which one or more of $—CH_2—$'s constituting a divalent alicyclic hydrocarbon group having 5 to 20 carbon atoms are substituted with —O—, —S—, or —NH—.

As the divalent alicyclic hydrocarbon group having 5 to 20 carbon atoms, a 5-membered ring or a 6-membered ring is preferable. In addition, the alicyclic hydrocarbon group may be saturated or unsaturated, but is preferably the saturated alicyclic hydrocarbon group. With regard to the divalent alicyclic hydrocarbon group, reference can be made to, for example, the description in paragraph of JP2012-021068A, the contents of which are hereby incorporated by reference.

As the alicyclic ring which is one aspect of the ring $B^1$, a cycloalkane ring having 5 to 20 carbon atoms is preferable. Examples of the cycloalkane ring having 5 to 20 carbon atoms include a cyclohexane ring, a cyclopeptane ring, a cyclooctane ring, a cyclododecane ring, and a cyclododecane ring. Among those, the cyclohexane ring is preferable, a 1,4-cyclohexylene group is more preferable, and a trans-1,4-cyclohexylene group is still more preferable.

Examples of the substituent which may be contained in the alicyclic ring which is one aspect of the ring $B^1$, including suitable aspects thereof, include the same ones as those of the substituent which may be contained in the aromatic ring which is one aspect of the ring $B^1$.

The alicyclic ring which is one aspect of ring $B^1$ preferably has no substituent.

The polymerizable liquid crystal compound preferably has at least one aromatic ring which may have a substituent, and more preferably has at least one group represented by Formula (III) which will be described later, as the ring $B^1$.

In addition, the polymerizable liquid crystal compound preferably has at least one cyclohexane ring, more preferably has at least one 1,4-cyclohexylene group, and still more preferably has at least one trans-1,4-cyclohexylene group, as the ring $B^1$.

That is, the polymerizable liquid crystal compound preferably has a combination consisting of at least one aromatic ring (more preferably a group represented by Formula (III) which will be described later) and at least one cyclohexane ring (more preferably 2 to 4 1,4-cyclohexylene groups), as the ring $B^1$.

In the polymerizable liquid crystal compound, the number of the rings $B^1$ existing on a bond that links the polymerizable groups $P^1$ and $P^2$ is not particularly limited, but from the viewpoint of the alignment stability of the liquid crystal compound, the number of the rings $B^1$ is preferably 3 to 7, more preferably 4 to 6, and still more preferably 5.

The polymerizable liquid crystal compound is preferably a compound represented by Formula (I) for a reason that the optical compensability is further improved.

$$P^1\text{-}Sp^1\text{-}(X^1—Ar^1)_{n1}—(X^2\text{-}Cy^1)_{m1}\text{-}X^3—Ar^3—X^4—(Cy^2\text{-}X^5)_{m2}—(Ar^2—X^6)_{n2}\text{-}Sp^2\text{-}P^2 \quad (I)$$

In Formula (I), $P^1$ and $P^2$ each independently represent a polymerizable group.

$Sp^1$ and $Sp^2$ each independently represent a single bond, a linear or branched alkylene group having 1 to 14 carbon atoms, or a divalent linking group in which one or more of —$CH_2$—'s constituting the linear or branched alkylene group having 1 to 14 carbon atoms are substituted with —O—, —S—, —NH—, —N(Q)-, or —CO—, where Q represents a substituent.

n1, m1, m2, and n2 each represent an integer from 0 to 4, and a sum of n1, m1, m2, and n2 is 4.

$X^1$, $X^2$, $X^3$, $X^4$, $X^5$, and $X^6$ each independently represent a single bond; or —CO—, —O—, —S—, —C(=S)—, —$CR^1R^2$—, —$CR^3$=$CR^4$—, —$NR^5$—, or a divalent linking group consisting of a combination of two or more of these groups, where $R^1$ to $R^5$ each independently represent a hydrogen atom, a fluorine atom, or an alkyl group having 1 to 12 carbon atoms. It should be noted that in a case where n1, m1, m2 or n2 is an integer of 2 to 4, a plurality of $X^1$'s, a plurality of $X^2$'s, a plurality of $X^5$'s, or the plurality of $X^6$'s may be the same as or different from each other.

$Ar^1$, $Ar^2$, and $Ar^3$ each independently represent an aromatic ring which may have a substituent. It should be noted that in a case where n1 or n2 is an integer of 2 to 4, a plurality of $Ar^1$'s or the plurality of $Ar^2$'s may be the same as or different from each other.

$Cy^1$ and $Cy^2$ each independently represent an alicyclic ring which may have a substituent. It should be noted that in a case where m1 or m2 is an integer of 2 to 4, a plurality of $Cy^1$'s or the plurality of $Cy^2$'s may be the same as or different from each other.

In Formula (I), examples of the polymerizable group represented by each of $P^1$ and $P^2$ include the same ones as those of the above-mentioned polymerizable groups which are radically polymerizable or cationically polymerizable; and among these, the above-mentioned polymerizable groups represented by any of Formulae (P-1) to (P-20) are preferable, and the acryloyloxy group or the methacryloyloxy group is more preferable.

Examples of the linear or branched alkylene group having 1 to 14 carbon atoms shown in one aspect of $Sp^1$ and $Sp^2$ in Formula (I) include a methylene group, an ethylene group, a propylene group, a butylene group, a pentylene group, a hexylene group, a methylhexylene group, and a heptylene group. Furthermore, as mentioned above, $Sp^1$ and $Sp^2$ may each be a divalent linking group in which one or more of —$CH_2$—'s constituting these alkylene groups are substituted with —O—, —S—, —NH—, —N(Q)-, or —CO—.

Examples of the substituent represented by Q, including suitable aspects thereof, include the same ones as those of the substituent which may be contained in the aromatic ring which is one aspect of the ring $B^1$.

As $Sp^1$ and $Sp^2$, a linear or branched alkylene group having 1 to 14 carbon atoms (more preferably having 2 to 10 carbon atoms) or a divalent linking group in which one or more of —$CH_2$—'s constituting the linear or branched alkylene group having 2 to 14 carbon atoms (more preferably having 4 to 12 carbon atoms) are substituted with —O— or —CO— is preferable.

In Formula (I), a sum of n1 and m1 and a sum of m2 and n2 are each preferably an integer of 1 to 3, and more preferably 2.

Above those, from the viewpoint of improving the alignment properties of the polymerizable liquid crystal compound, it is preferable that all of n1, m1, m2, and n2 are 1; and from the viewpoint of improving the durability, it is preferable that both of n1 and n2 are 0, and both of m1 and m2 are 2.

In Formula (I), examples of the divalent linking group represented by each of $X^1$, $X^2$, $X^3$, $X^4$, $X^5$, and $X^6$ include —CO—, —O—, —CO—O—, —C(=S)O—, —$CR^1R^2$—, —$CR^1R^2$—$CR^1R^2$, —O—$CR^1R^2$, —$CR^1R^2$—O—$CR^1R^2$, —CO—O—$CR^1R^2$—, —O—CO—$CR^1R^2$, —$CR^1R^2$—O—CO—$CR^1R^2$, —$CR^1R^2$—CO—O—$CR^1R^2$O, —$NR^5$—$CR^1R^2$—, and —CO—$NR^5$—. $R^1$, $R^2$, and $R^5$ each independently represent a hydrogen atom, a fluorine atom, or an alkyl group having 1 to 12 carbon atoms.

As $X^1$, $X^2$, $X^3$, $X^4$, $X^5$, and $X^6$, the single bond, —CO—, —O—, or —COO— is preferable.

In Formula (I), examples of the aromatic ring which may have a substituent, represented by each of $Ar^1$, $Ar^2$, and $Ar^3$ include the same ones as those of the aromatic ring which may have a substituent, which is one aspect of the ring $B^1$.

From the viewpoint of improving the alignment properties of the polymerizable liquid crystal compound, as $Ar^3$ in Formula (I), an aromatic ring having 10 or more π-electrons is preferable, an aromatic ring having 10 to 18 π-electrons is more preferable, and an aromatic ring having 10 to 14 π-electrons is still more preferable.

Among those, as $Ar^3$ in Formula (I), a group represented by Formula (III) is preferable.

(III)

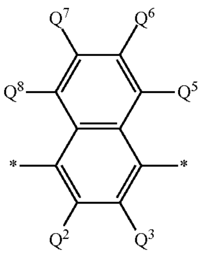

In Formula (III), $Q^2$, $Q^3$, $Q^5$, $Q^6$, $Q^7$, and $Q^8$ each independently represent a hydrogen atom or a substituent. * represents a bonding position.

In Formula (III), it is preferable that all of $Q^2$, $Q^3$, $Q^5$, $Q^6$, $Q^7$, and $Q^8$ are hydrogen atoms, or one or two of $Q^2$, $Q^3$, $Q^5$, $Q^6$, $Q^7$, and $Q^8$ represent substituents. Among those, it is more preferable that one or two of $Q^2$, $Q^3$, $Q^5$, $Q^6$, $Q^7$, and $Q^8$ represent substituents and the others represent hydrogen atoms; and it is still more preferable that one represents a substituent and the others represent hydrogen atoms.

In Formula (III), it is preferable that the group representing a substituent among $Q^2$, $Q^3$, $Q^5$. $Q^6$, $Q^7$, and $Q^8$ is any of $Q^5$, $Q^6$, $Q^7$, and $Q^8$, and it is more preferable that at least one of $Q^5$ or $Q^8$ is a substituent and at least one of $Q^6$ or $Q^7$ represents a substituent.

As the substituent represented by each of $Q^2$, $Q^3$, $Q^5$, $Q^6$, $Q^7$, and $Q^8$ in Formula (III), including suitable aspects thereof, include the same ones as those of the substituent which may be contained in the aromatic ring which is one aspect of the ring $B^1$.

Among those, an alkyl group having 1 to 4 carbon atoms, an alkoxy group having 1 to 4 carbon atoms, a group in which an oxycarbonyl group is bonded to an alkyl group having 1 to 4 carbon atoms, a group in which a carbonyloxy group is bonded to an alkyl group having 1 to 4 carbon atoms, a fluorine atom, or a chlorine atom is preferable, and the alkyl group having 1 to 4 carbon atoms, a methoxy group, an ethoxy group, a methoxycarbonyl group, or a methylcarbonyloxy group is more preferable.

Moreover, suitable specific examples of $Ar^3$ in Formula (I) include groups represented by Formulae (IV-1) to (IV-3).

(IV-1)

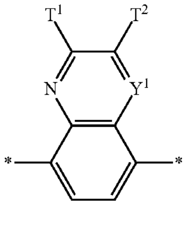

-continued (IV-2)

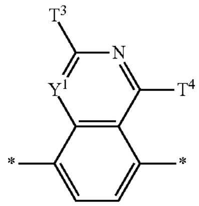

(IV-3)

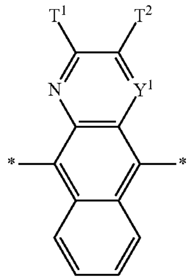

In Formulae (IV-1) to (IV-3), $Y^1$ represents —C(Ry)= or —N=, and Ry is a hydrogen atom, a fluorine atom, a chlorine atom, a trifluoromethyl group, a trifluoromethoxy group, an alkyl group having 1 to 12 carbon atoms, or a phenyl group.

In Formulae (IV-1) to (IV-3), $T^1$, $T^2$, and $T^3$ each independently represent a hydrogen atom, a fluorine atom, a chlorine atom, a trifluoromethyl group, a trifluoromethoxy group, an alkyl group having 1 to 12 carbon atoms, an alkoxy group having 1 to 12 carbon atoms, an alkoxycarbonyl group having 1 to 12 carbon atoms, an alkylcarbonyl group having 1 to 12 carbon atoms, an aromatic rings having the number of π electrons of 6 to 18, or a monovalent organic group in which at least one of —$CH_2$—'s in the alkyl group, the alkoxy group, the alkoxycarbonyl group, or the alkylcarbonyl group is substituted with —O—, —CO—, or —S—. In addition, $T^1$ and $T^2$ may be bonded to each other to form a ring.

In Formulae (IV-1) to (IV-3), $T^4$'s independently represent a hydrogen atom, a fluorine atom, a chlorine atom, a trifluoromethyl group, a trifluoromethoxy group, an alkyl group having 1 to 12 carbon atoms, or a phenyl group. * represents a bonding position.

With regard to the polymerizable liquid crystal compound having the aromatic ring represented by each of Formulae (IV-1) to (IV-3), reference can be made to the description in paragraphs to of JP2017-125009A, the contents of which are hereby incorporated by reference.

In Formula (I), as $Ar^1$ and $Ar^2$, an aromatic ring having the number of π electrons of 6 or 10 is preferable, an aromatic ring having the number of π electrons of 6 is more preferable, and the benzene ring (for example, a 1,4-phenylene group) is still more preferable.

In Formula (I), examples of the substituent which may be contained in the aromatic ring represented by each of $Ar^1$ and $Ar^2$, including suitable aspects thereof, include the same ones as those of the substituent which may be contained in the aromatic ring which is one aspect of the ring $B^1$.

In Formula (I), the alicyclic ring which may have a substituent, represented by each of $Cy^1$ and $Cy^2$, including suitable aspects thereof, include the same ones as those of the alicyclic ring, which may have a substituent, which is one aspect of the ring $B^1$.

In addition, examples of the compound represented by Formula (I) include a compound (1-1) to a compound (1-21) represented by the following formulae. Moreover, a group adjacent to the acryloyloxy group in the structure of the compound (1-14) represents a propylene group (a group obtained by substituting a methyl group with an ethylene group), and the compound (1-14) and the compound (1-21) each represent a mixture of regioisomers in which the positions of the methyl groups are different.

(1-1)

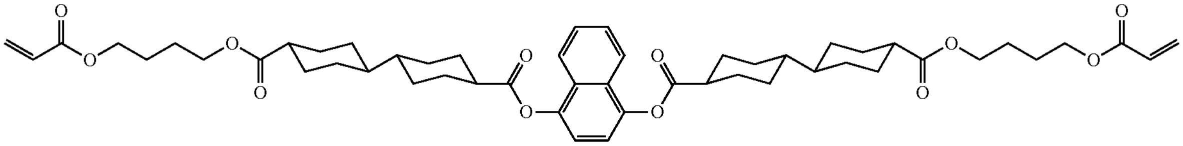

(1-2)

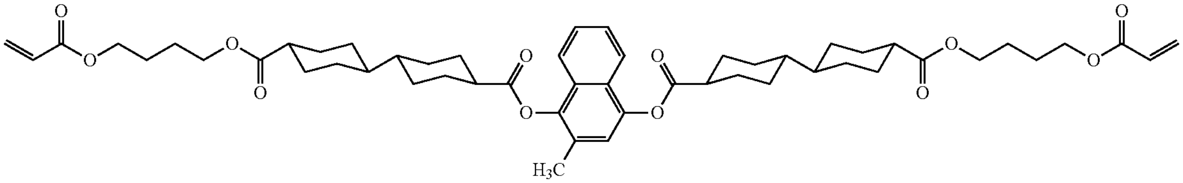

(1-3)

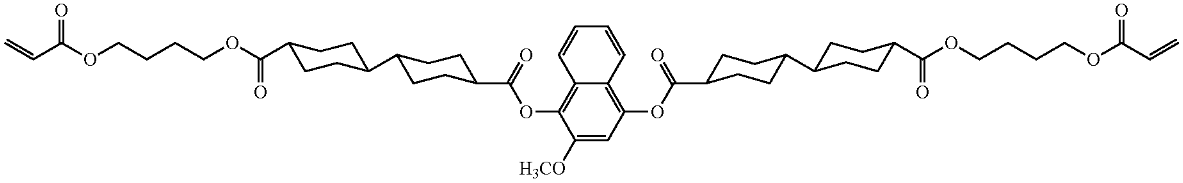

(1-4)

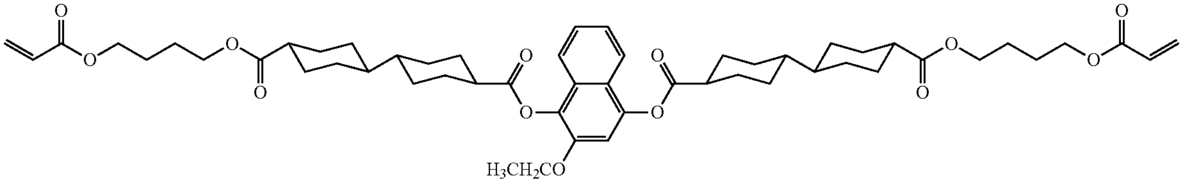

(1-5)

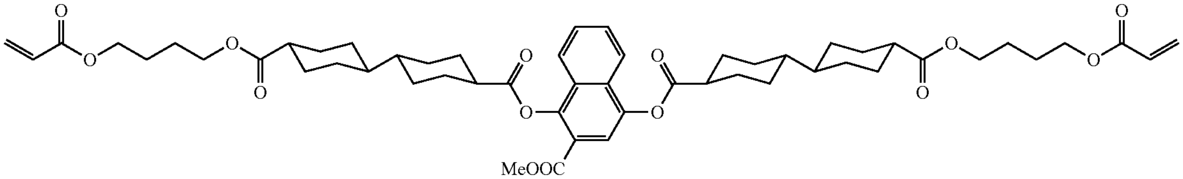

(1-6)

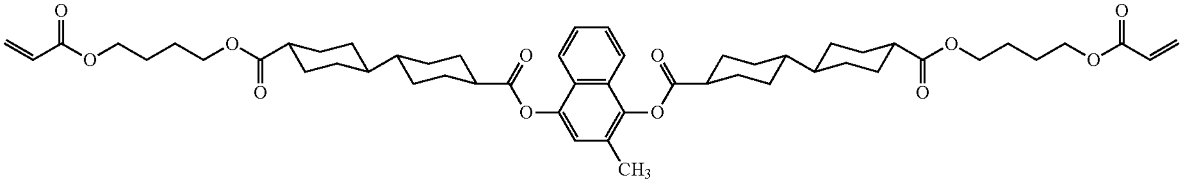

(1-7)

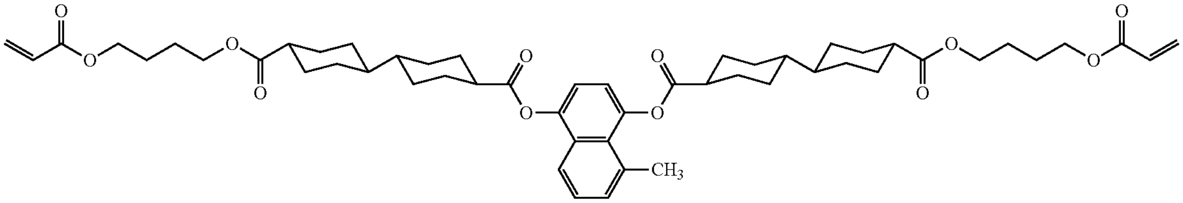

-continued
(1-8)
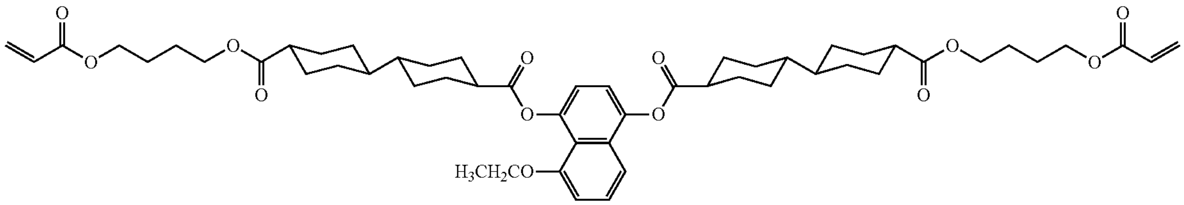
(1-9)
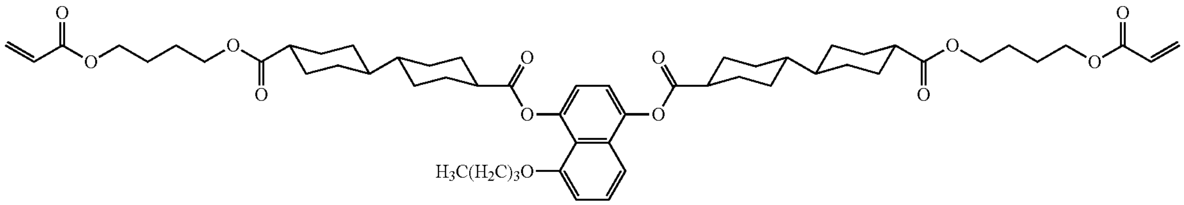
(1-10)
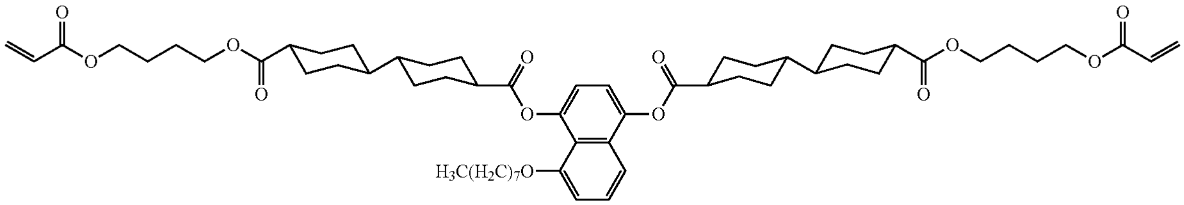
(1-11)
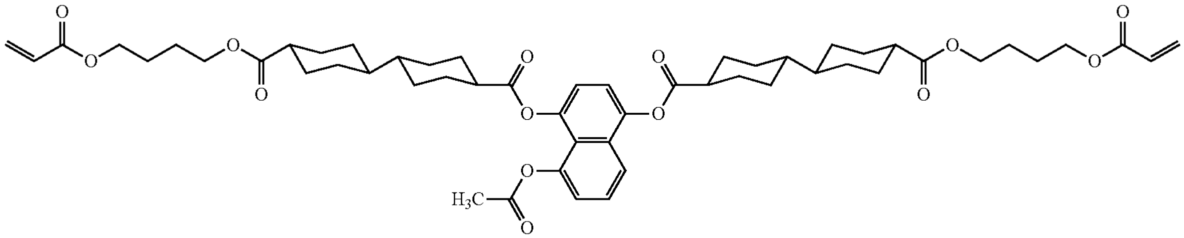
(1-12)
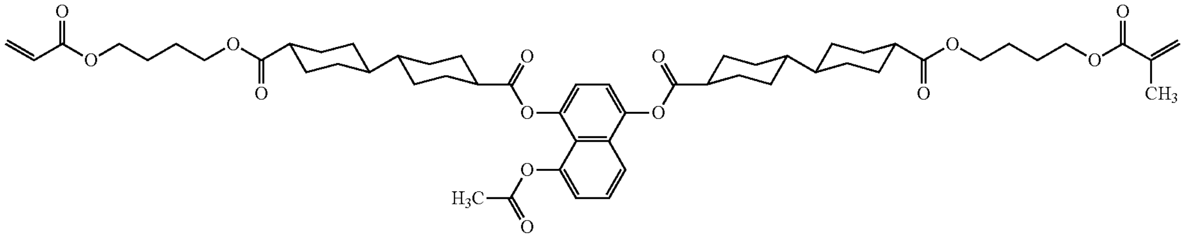
(1-13)
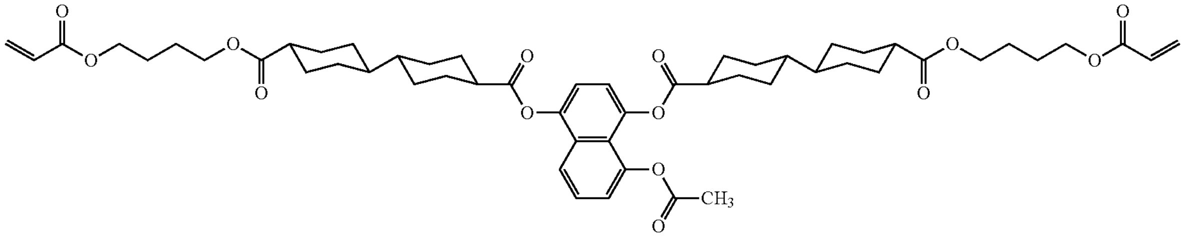

-continued
(1-14)
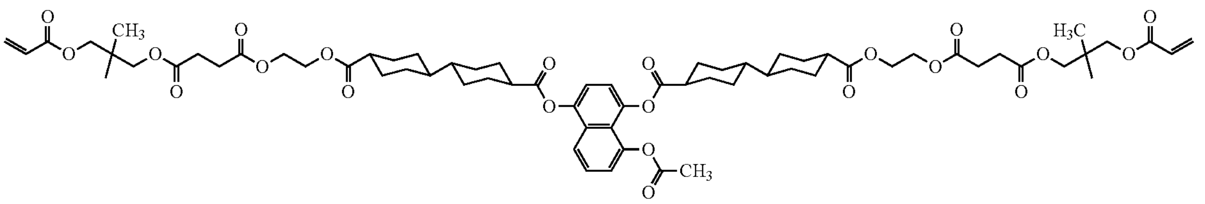
(1-15)
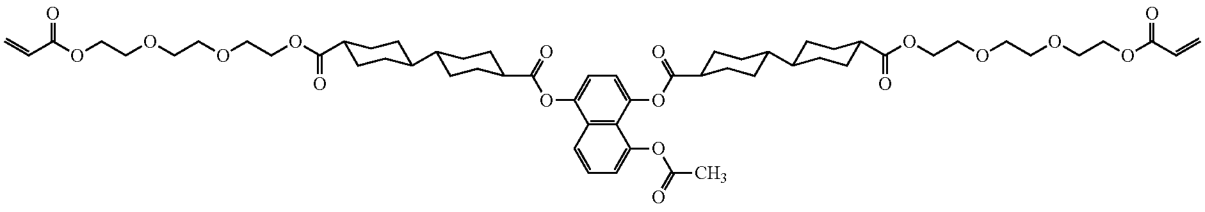
(1-16)
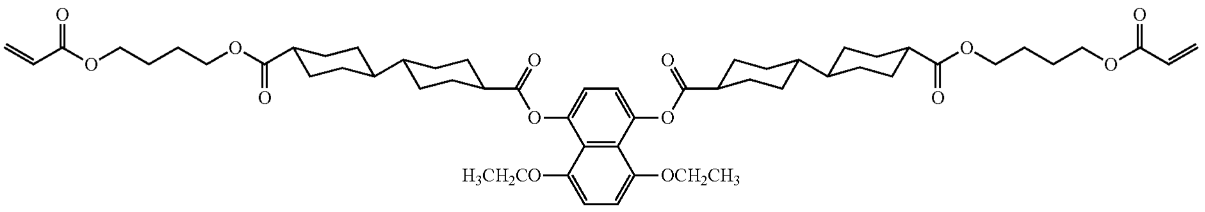
(1-17)
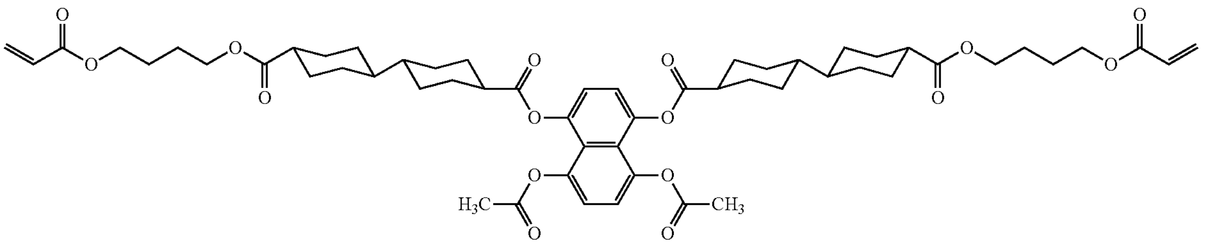
(1-18)
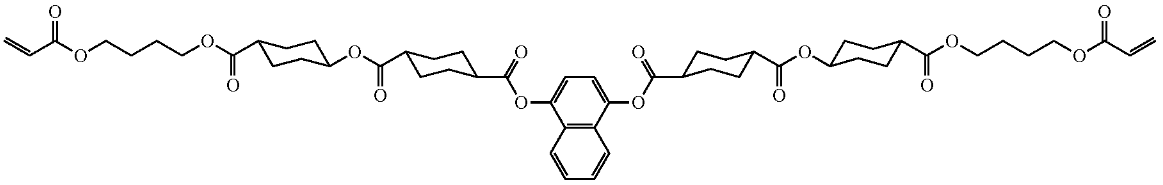
(1-19)
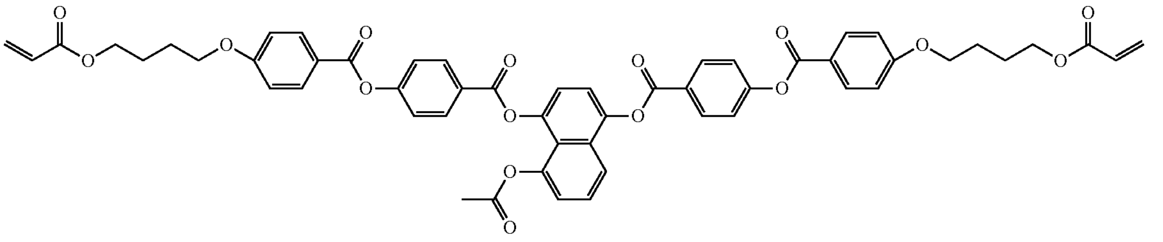
(1-20)
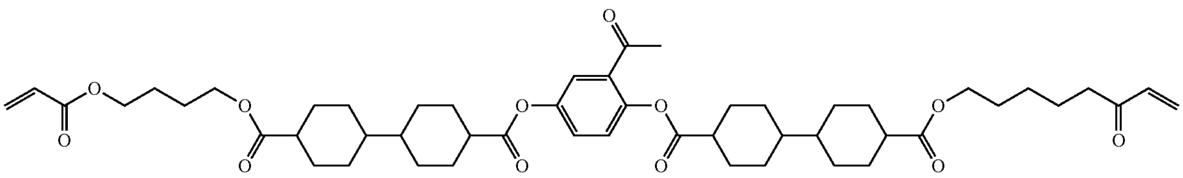

-continued (1-21)

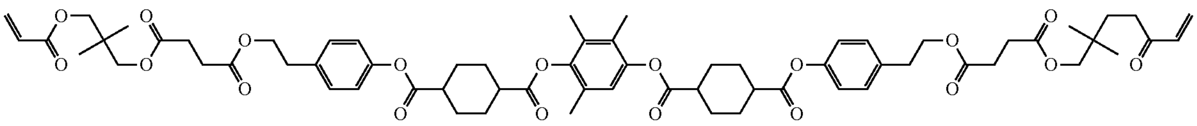

In addition, examples of the compound represented by Formula (I) include the compounds described in paragraphs to of JP2017-125009A.

It is preferable that the polymerizable liquid crystal compound is a compound exhibiting a liquid crystal state of a smectic phase for a reason that the contrast of an image display device having the optically anisotropic layer is good.

Among those, the liquid crystal state of the smectic phase exhibited by the polymerizable liquid crystal compound is preferably a higher-order smectic phase. The higher-order smectic phase as mentioned herein is a smectic A phase, a smectic B phase, a smectic D phase, a smectic E phase, a smectic F phase, a smectic G phase, a smectic H phase, a smectic I phase, a smectic J phase, a smectic K phase, or a smectic L phase, and among these, the smectic A phase, the smectic B phase, the smectic F phase, the smectic I phase, the slanted smectic F phase, or the slanted smectic I phase is preferable, and the smectic A phase or the smectic B phase is more preferable.

<Monofunctional Compound>

The monofunctional compound included in the present composition has a polymerizable group $P^3$ that is polymerizable with the polymerizable liquid crystal compound, constituting one terminal of the monofunctional compound, an aromatic ring Ar which may have a substituent, constituting the other terminal of the monofunctional compound, and one or more rings $B^2$ existing on a bond that links the polymerizable group $P^3$ and the aromatic ring Ar, and selected from the group consisting of an aromatic ring which may have a substituent and an alicyclic ring which may have a substituent.

In addition, the monofunctional compound satisfies the relationship of Expressions (1) and (2) mentioned above with the polymerizable liquid crystal compound.

Examples of the polymerizable group $P^3$ constituting one terminal of the monofunctional compound, including suitable aspects thereof, include the same ones as those of the polymerizable groups $P^1$ and $P^2$ of the above-mentioned polymerizable liquid crystal compound, and among these, the polymerizable group represented by any of Formulae (P-1) to (P-20) mentioned above is preferable.

Examples of the aromatic ring Ar constituting the other terminal of the monofunctional compound include aromatic rings having 6 to 20 carbon atoms, and more specifically aromatic hydrocarbon rings such as a benzene ring, a naphthalene ring, an anthracene ring, and a phenanthroline ring; and aromatic heterocyclic rings such as a furan ring, a thiophene ring, a pyrrole ring, an oxazole ring, an isoxazole ring, an oxadiazole ring, a thiazole ring, an isothiazole ring, a thiadiazole ring, an imidazole ring, a pyrazole ring, a triazole ring, a furazan ring, a tetrazole ring, a pyridine ring, a pyridazine ring, a pyrimidine ring, a pyrazine ring, a triazine ring, a tetrazine ring, and a benzothiazole ring, and among these, the benzene ring (a phenyl group) is preferable.

Furthermore, examples of the substituent which may be contained in the aromatic ring Ar, including suitable aspects thereof, include the same ones as those of the substituent which may be contained in the aromatic ring which is one aspect of the ring $B^1$, described in the polymerizable liquid crystal compound mentioned above.

The aromatic ring Ar constituting the other terminal of the monofunctional compound more preferably has no substituent.

In a monofunctional compound, the expression of the ring $B^2$ "which exists on a bond that links the polymerizable group $P^3$ and the aromatic ring Ar" means that the ring $B^2$ constitutes a part of a portion necessary for directly linking the polymerizable group $P^3$ and the aromatic ring Ar.

Examples of the aromatic ring which may have a substituent and the alicyclic ring which may have a substituent, represented by the ring $B^2$, including suitable aspects thereof, include the aromatic ring which may have a substituent and the alicyclic ring which may have a substituent, represented by the ring $B^1$, described in the polymerizable liquid crystal compound mentioned above.

The monofunctional compound preferably has at least one cyclohexane ring, more preferably has at least one 1,4-cyclohexylene group, and still more preferably has at least one trans-1,4-cyclohexylene group, as the ring $B^2$.

The number of the rings $B^2$ contained in the monofunctional compound is not particularly limited, but is preferably 1 to 3, more preferably 1 or 2, and still more preferably 2 from the viewpoint of improving the alignment properties of the polymerizable liquid crystal compound. The monofunctional compound is preferably a compound represented by Formula (II) from the viewpoint of improving the alignment properties of the polymerizable liquid crystal compound.

$$P^3\text{-}Sp^3\text{-}(X^7\text{—}Ar^4)_{n3}\text{—}(X^8\text{-}Cy^3)_{m3}\text{-}(X^9\text{—}Ar^5)_{n4}\text{—}X^{10}\text{—}Ar^6 \quad \text{(II)}$$

In Formula (I), $P^3$ represents a polymerizable group that is polymerizable with the polymerizable liquid crystal compound.

- $Sp^3$ represents a single bond, a linear or branched alkylene group having 1 to 14 carbon atoms, or a divalent linking group in which one or more of —$CH_2$—'s constituting the linear or branched alkylene group having 1 to 14 carbon atoms are substituted with —O—, —S—, —NH—, —N(Q)-, or —CO—, where Q represents a substituent.
- n3, n4, and m3 represent an integer from 0 to 2, and a sum of n3, n4, and m3 is 2.
- $X^7$, $X^8$, $X^9$, and $X^{10}$ each independently represent a single bond; or —CO—, —O—, —S—, —C(=S)—, —$CR^1R^2$—, —$CR^3$=$CR^4$—, —$NR^5$—, or a divalent linking group consisting of a combination of two or more of these groups, where $R^1$ to $R^5$ each independently represent a hydrogen atom, a fluorine atom, or an alkyl group having 1 to 12 carbon atoms. It should be noted that in a case where n3 is 2, a plurality of $X^7$'s may be the same as or different from each other; and in a case where m3 is 2, a plurality of $X^8$'s may be the same as or different from each other.

$Ar^4$, $Ar^5$, and $Ar^6$ each independently represent an aromatic ring which may have a substituent. It should be noted that in a case where n3 and n4 are 2, a plurality of $Ar^4$'s and $Ar^5$'s may be the same as or different from each other.

$Cy^3$ represents an alicyclic ring which may have a substituent. It should be noted that in a case where m3 is 2, a plurality of $Cy^3$'s may be the same as or different from each other.

In Formula (II), examples of the polymerizable group represented by $P^3$ include the same ones as those of the polymerizable groups which are radically polymerizable or cationically polymerizable, described in the polymerizable liquid crystal compound mentioned above; and among these, the polymerizable groups represented by any of Formulae (P-1) to (P-20) mentioned above are preferable, and the acryloyloxy group or the methacryloyloxy group is more preferable.

In Formula (II), examples of the linear or branched alkylene group having 1 to 14 carbon atoms, represented by one aspect of $Sp^3$, including suitable aspects thereof, include the same ones as those of the linear or branched alkylene group having 1 to 14 carbon atoms, represented by one aspect of $Sp^1$ and the like in Formula (I).

As $Sp^3$, a linear or branched alkylene group having 1 to 14 carbon atoms or a divalent linking group in which one or more of $-CH_2-$'s constituting the linear or branched alkylene group having 1 to 14 carbon atoms are substituted with —O— or —CO— is preferable, and a linear or branched alkylene group having 1 to 10 carbon atoms is more preferable.

In Formula (II), n3 is preferably 0 or 1, n4 is preferably 0 or 1, and m3 is preferably 1 or 2.

In a case where the polymerizable liquid crystal compound is a compound represented by Formula (I) and the monofunctional compound is a compound represented by Formula (II), the contrast of an image display device having the optically anisotropic layer is more excellent, and from the viewpoint that the generation of defects in the optically anisotropic layer can be further suppressed, an aspect in which in Formula (II), n4 is 0 and both of n3 and m3 are the same as both n1 and m1 in Formula (I), respectively, or an aspect in which n4 is 0 and n3 and m3 are the same as n2 and m2 in Formula (I), respectively, is preferable.

In Formula (II), examples of the divalent linking group represented by each of $X^1$, $X^8$, $X^9$, and $X^{10}$ include the same ones as those described in $X^1$ to $X^6$ in Formula (I).

As $X^7$, $X^8$, $X^9$, and $X^{10}$, the single bond, —CO—, —O—, or —COO— is preferable.

In Formula (II), the aromatic ring which may have a substituent, represented by each of $Ar^4$ and $Ar^5$, include the same ones as those of the aromatic ring which may have a substituent, which is one aspect of the ring $B^1$. Among those, the benzene ring (for example, a 1,4-phenylene group) is preferable.

In Formula (II), examples of the alicyclic ring which may have a substituent, represented by $Cy^3$, include the same ones as those of the alicyclic ring which may have a substituent, which is one aspect of the ring $B^1$. Among those, the cycloalkane ring is preferable, the cyclohexane ring is more preferable, the 1,4-cyclohexylene group is still more preferable, and the trans-1,4-cyclohexylene group is particularly preferable.

In Formula (II), examples of the aromatic ring which may have a substituent, represented by $Ar^6$, include the same ones as those of the aromatic ring which may have a substituent, which is one aspect of the ring $B^1$. Among those, the benzene ring which may have a substituent is preferable, and a benzene ring (phenyl group) which does not have a substituent is further preferable.

Specific examples of the compound represented by Formula (II) include compounds represented by Formulae (TN-1) to (TN-16).

(TN-1)

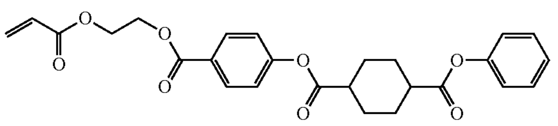

(TN-2)

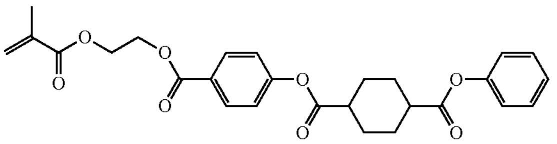

(TN-3)

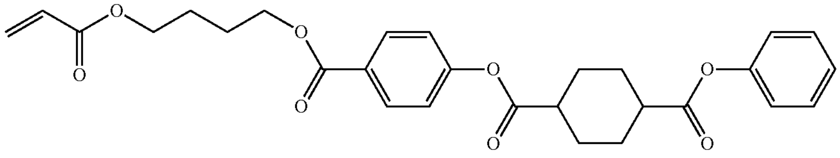

(TN-4)

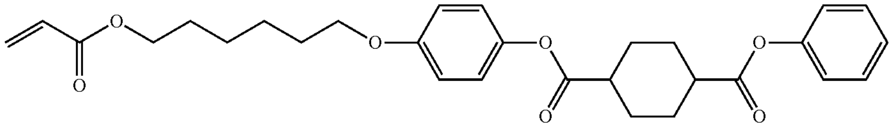

(TN-5)

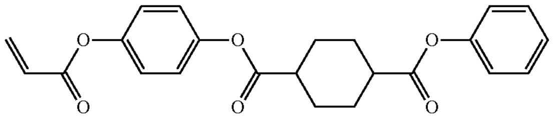

(TN-6)

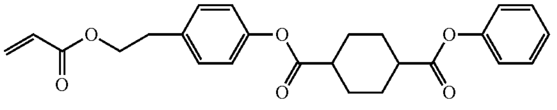

-continued (TN-7)

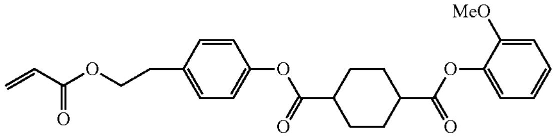

(TN-8)

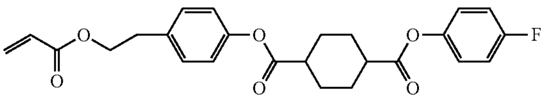

(TN-9)

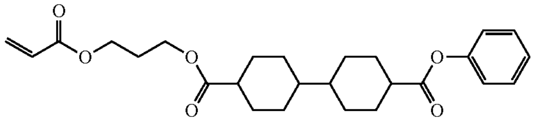

(TN-10)

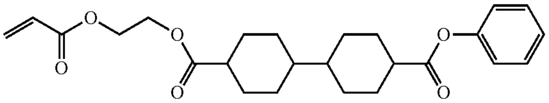

(TN-11)

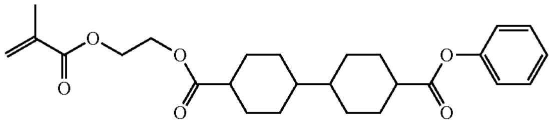

(TN-12)

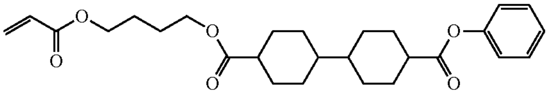

(TN-13)

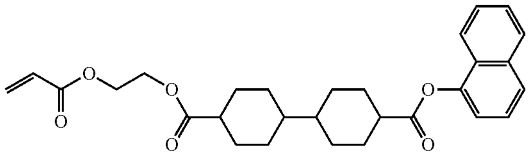

(TN-14)

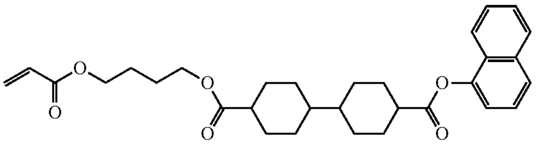

(TN-15)

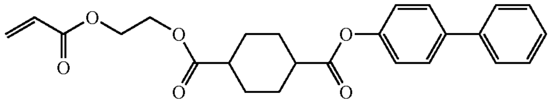

(TN-16)

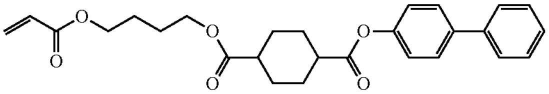

Specific examples of the monofunctional compound other than the compound represented by Formula (II) include compounds represented by Formulae (TN-17) to (TN-20).

(TN-17)

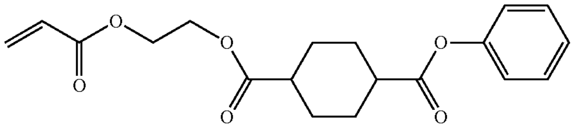

(TN-18)

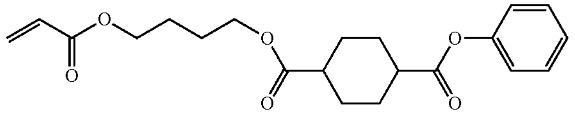

(TN-19)

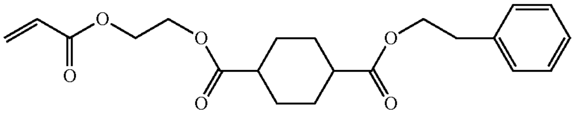

(TN-20)

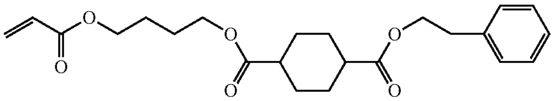

From the viewpoint of suppressing alignment defects due to shrinkage during curing without disturbing the alignment of the liquid crystal compound, a content of the monofunctional compound is preferably 1 to 100 parts by mass, and more preferably 5 to 50 parts by mass with respect to 100 parts by mass of the polymerizable liquid crystal compound.

<Combination of Polymerizable Liquid Crystal Compound and Monofunctional Compound>

From the viewpoint that the contrast of an image display device having the optically anisotropic layer is more excellent and the generation of defects of the optically anisotropic layer can be further suppressed, it is preferable that the array of the rings consisting of the rings $B^2$ and the rings Ar arranged in order from the polymerizable group $P^3$ in the monofunctional compound is the same as the array of the ring $B^1$ arranged from the polymerizable group $P^1$ or $P^2$ in the polymerizable liquid crystal compound.

Here, with regard to the array of the rings in the polymerizable liquid crystal compound and the monofunctional compound, in a case where all of objects to be compared are aromatic rings, it is considered that the rings constitute the same array even though the rings have different ring structures or substituents; and in a case where all of objects to be compared are alicyclic rings, it is considered that the rings constitute the same array even though the rings have different ring structures or substituents. In addition, it is assumed that the array of the rings does not include the structure of a linking portion between the two rings. In a case where all of rings to be compared are aromatic rings, it is considered that the rings constitute the same array even though the rings have different skeletons as in cases with, for example, a phenylene group and a naphthylene group; and in a case where all of rings to be compared are alicyclic rings, it is considered that they rings constitute the same array even though the rings have different skeletons as in cases with, for example, cyclohexylene and cyclopentalene.

For example, an array of rings consisting of the ring $B^2$ and the ring Ar arranged in order from the polymerizable group $P^3$ in the following monofunctional compound M-1 is the same as an array of the rings $B^1$ arranged from the polymerizable group $P^1$ or $P^2$ in the following polymerizable liquid crystal compound L-1.

L-1

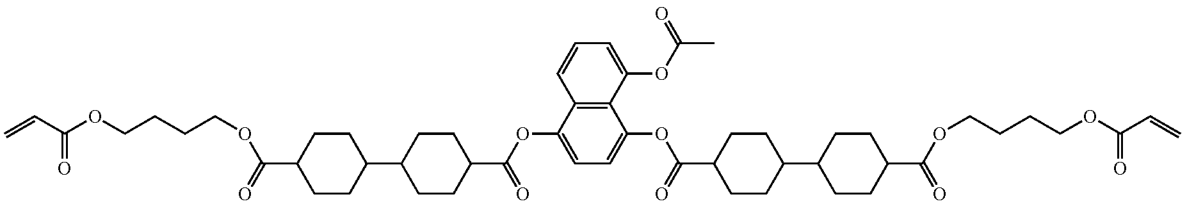

M-1

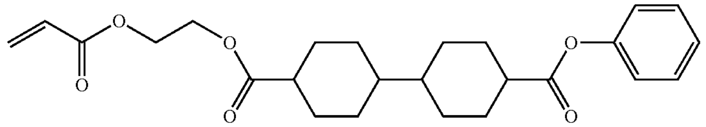

From the viewpoint that the generation of defects in the optically anisotropic layer can be further suppressed, it is preferable that a structure of a portion W2 from the ring $B^2$ closest to the polymerizable group $P^3$ to the group closest to the aromatic ring Ar on the bond that links the polymerizable group $P^3$ of the monofunctional compound and the aromatic ring Ar is the same as a structure of a portion W1 from the ring $B^1$ closest to the polymerizable group $P^1$ or $P^2$ on the bond that links the polymerizable groups $P^1$ and $P^2$ of the polymerizable liquid crystal compound.

Here, the portion W2 in the monofunctional compound includes the ring $B^2$ closest to the polymerizable group $P^3$ and the group closest to the aromatic ring Ar, and does not include the aromatic ring Ar. In addition, the portion W1 in the polymerizable liquid crystal compound includes one of the ring $B^1$ closest to the polymerizable group P' and the ring $B^1$ closest to the polymerizable group $P^2$ among the three or more rings $B^1$. In a case where the polymerizable liquid crystal compound has the same structure as the portion W2 in the monofunctional compound as the structure of the portion W1 from the ring $B^1$ closest to the polymerizable group $P^1$ or $P^2$, the ring $B^2$ closest to the polymerizable group $P^3$ in the monofunctional compound is the same as at least one of the ring $B^1$ closest to the polymerizable group $P^1$ or the ring $B^1$ closest to the polymerizable group $P^2$ in the polymerizable liquid crystal compound.

Furthermore, the expression that the structure of the portion W1 contained in the polymerizable liquid crystal compound and the structure of the portion W2 contained in the monofunctional compound are the same means that the ring $B^1$ and the divalent linking group constituting the portion W1, and the ring $B^3$ and the divalent linking group constituting the portion W2 are exactly the same in terms of, for example, the types, the order of arrangement, and the substituents. In addition, there exist cases where since the portion W2 of the monofunctional compound does not include the aromatic ring Ar, the polymerizable liquid crystal compound has the portion W1 having the same structure as the structure of the portion W2 of the monofunctional compound, and does not have the aromatic ring Ar contained in the monofunctional compound.

The portion W1 of the polymerizable liquid crystal compound and the portion W2 of the monofunctional compound will be more specifically described.

In a case where the polymerizable liquid crystal compound is a compound represented by Formula (I), a portion obtained by taking $X^1$ bonded to $Sp^1$ in a case where n1 represents an integer of 1 to 4 or $X^2$ bonded to $Sp^1$ in a case where n1 represents 0, from a partial structure represented by "$(X^1—Ar^1)_{n1}—(X^2\text{-}Cy^1)_{m1}—X^3$" in Formula (I); or a portion obtained by taking $X^6$ bonded to $Sp^2$ in a case where n2 represents an integer of 1 to 4 and $X^5$ bonded to $Sp^2$ in a case where n2 represents 0 from a partial structure represented by "$X^4—(Cy^2\text{-}X^5)_{m2}—(Ar^2—X^6)_{n2}$" corresponds to the portion W1.

In addition, in a case where the monofunctional compound is a compound represented by Formula (II), a portion obtained by taking $X^7$ bonded to $Sp^3$ in a case where n3 represents 1 or 2, $X^8$ bonded to $Sp^3$ in a case where n3 represents 0 and m3 represents 1 or 2, or $X^9$ bonded to $Sp^3$ in a case where n3 represents 0 and m3 represents 0 from a partial structure represented by "$(X^7—Ar^4)_{n3}—(X^8\text{-}Cy^3)_{m3}—(X^9—Ar^5)_{n4}—X^{10})$" in Formula (II) corresponds to the portion W2. That is, the "ring $B^2$ closest to the polymerizable group $P^3$" included in the portion W2 is a ring which exists on the leftmost side on the paper surface among $Ar^4$, $Cy^3$, and $Ar^5$. In addition, in this case, in a case where $X^{10}$ represents the divalent linking group, the group closest to the aromatic ring Ar is $X^{10}$; in a case where $X^{10}$ represents a single bond and n4 represents 1 or 2, the group closest to the aromatic ring Ar is $Ar^5$; in a case where $X^{10}$ represents a single bond, n4 represents 0, and m3 represents 1 or 2, the group closest to the aromatic ring Ar is $Cy^3$; and in a case where $X^{10}$ represents a single bond, n4 represents 0, and m3 represents 0, the group closest to the aromatic ring Ar is $Ar^4$.

More specifically, in the combination of the following polymerizable liquid crystal compound L-1 and the following monofunctional compound M-1, the portions enclosed in parentheses correspond to the portions W1 and W2, respectively. That is, in the monofunctional compound M-1, the 1,4-cycloalkylene group existing on the left side on the paper surface corresponds to "the ring $B^2$ closest to the polymerizable group $P^3$", and the oxygen atom bonded to the phenyl group corresponds to "the group closest to the aromatic ring Ar". In addition, in the polymerizable liquid crystal compound L-1, both the 1,4-cycloalkylene group existing on the leftmost side on the paper surface and the 1,4-cycloalkylene group existing on the rightmost side on the paper surface correspond to "the ring $B^1$ closest to the polymerizable group $P^1$ or $P^2$".

That is, in the case of the combination of the polymerizable liquid crystal compound L-1 and the monofunctional compound M-1, it can be said that the polymerizable liquid crystal compound L-1 has two structures in the molecule, which are the same as that of the portion W2 of the monofunctional compound M-1.

L-1

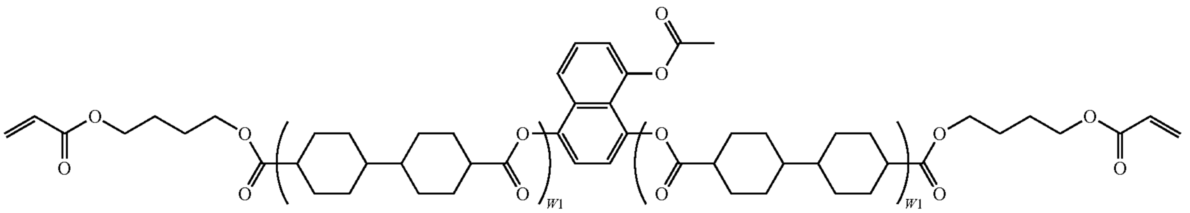

M-1

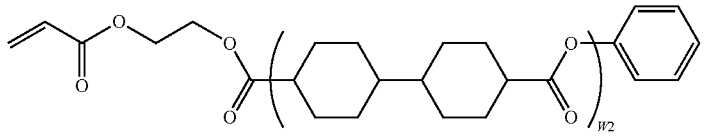

<Polymerization Initiator>

The present composition preferably includes a polymerization initiator.

As the polymerization initiator, a photopolymerization initiator capable of initiating a polymerization reaction upon irradiation with ultraviolet rays is preferable.

Examples of the photopolymerization initiator include a-carbonyl compounds (described in each of the specifications of U.S. Pat. Nos. 2,367,661A and 2,367,670A), acyloin ethers (described in the specification of U.S. Pat. No. 2,448,828A), α-hydrocarbon-substituted aromatic acyloin compounds (described in the specification of U.S. Pat. No. 2,722,512A), multinuclear quinone compounds (described in each of the specifications of U.S. Pat. Nos. 3,046,127A and 2,951,758A), combinations of a triarylimidazole dimer and a p-aminophenyl ketone (described in the specification of U.S. Pat. No. 3,549,367A), acridine and phenazine compounds (described in JP1985-105667A (JP-S60-105667A) and the specification of U.S. Pat. No. 4,239,850A), oxadiazole compounds (described in the specification of U.S. Pat. No. 4,212,970A), and acyl phosphine oxide compounds (described in JP1988-040799B (JP-S63-040799B), JP1993-029234B (JP-H05-029234B), JP1998-095788A (JP-H10-095788A), and JP1998-029997A (JP-H10-029997A)).

As the polymerization initiator, an oxime-type polymerization initiator is also preferable. Specific examples thereof include the initiators described in paragraphs [0049] to [0052] of WO2017/170443A.

<Solvent>

It is preferable that the present composition includes a solvent from the viewpoint of workability in formation of an optically anisotropic layer, and the like.

Examples of the solvent include ketones (for example, acetone, 2-butanone, methyl isobutyl ketone, cyclohexanone, and cyclopentanone), ethers (for example, dioxane and tetrahydrofuran), aliphatic hydrocarbons (for example, hexane), alicyclic hydrocarbons (for example, cyclohexane), aromatic hydrocarbons (for example, toluene, xylene, and trimethylbenzene), halogenated carbons (for example, dichloromethane, dichloroethane, dichlorobenzene, and chlorotoluene), esters (for example, methyl acetate, ethyl acetate, and butyl acetate), water, alcohols (for example, ethanol, isopropanol, butanol, and cyclohexanol), cellosolves (for example, methyl cellosolve and ethyl cellosolve), cellosolve acetates, sulfoxides (for example, dimethyl sulfoxide), and amides (for example, dimethylformamide and dimethylacetamide). The solvents may be used singly or in combination of two or more kinds thereof.

<Leveling Agent>

It is preferable that the present composition includes a leveling agent from the viewpoint that the surface of an optically anisotropic layer is maintained smooth and the alignment is easily controlled.

Such a leveling agent is preferably a fluorine-based leveling agent or a silicon-based leveling agent for a reason that it has a high leveling effect on the addition amount, and the leveling agent is more preferably a fluorine-based leveling agent from the viewpoint that it is less likely to cause bleeding (bloom or bleed).

Examples of the leveling agent include the compounds described in paragraphs [0079] to [0102] of JP2007-069471A, the compound represented by General Formula (I) described in JP2013-047204A (in particular, the compounds described in paragraphs [0020] to [0032]), the compound represented by General Formula (I) described in JP2012-211306A (in particular, the compounds described in paragraphs [0022] to [0029]), the liquid crystal alignment accelerator represented by General Formula (I) described in JP2002-129162A (in particular, the compounds described in paragraphs [0076] to [0078] and [0082] to [0084]), and the compounds represented by General Formulae (I), (II), and (III) described in JP2005-099248A (in particular, the compounds described in paragraphs [0092] to [0096]). Furthermore, the leveling agent may also function as an alignment control agent which will be described later.

<Alignment Control Agent>

The present composition may include an alignment control agent as necessary.

With the alignment control agent, various alignment states such as homeotropic alignment (vertical alignment), tilt alignment, hybrid alignment, and cholesteric alignment can be formed, in addition to the homogeneous alignment, and specific alignment states can be controlled and achieved more uniformly and more accurately.

As an alignment control agent which accelerates the homogeneous alignment, for example, a low-molecular-weight alignment control agent and a high-molecular-weight alignment control agent can be used.

With regard to the low-molecular-weight alignment control agent, reference can be made to the description in, for example, paragraphs [0009] to [0083] of JP2002-020363A, paragraphs [0111] to [0120] of JP2006-106662A, and paragraphs [0021] to [0029] of JP2012-211306A, the contents of which are hereby incorporated by reference.

In addition, with regard to the high-molecular-weight alignment control agent, reference can be made to the description in, for example, paragraphs [0021] to [0057] of JP2004-198511A and paragraphs [0121] to [0167] of JP2006-106662A, the contents of which are hereby incorporated by reference.

Moreover, examples of an alignment control agent which forms or accelerates a homeotropic alignment include a boronic acid compound and an onium salt compound. With regard to the alignment control agent, reference can be made to the description in the compounds described in paragraphs [0023] to [0032] of JP2008-225281A, paragraphs [0052] to [0058] of JP2012-208397A, paragraphs [0024] to [0055] of JP2008-026730A, and paragraphs [0043] to [0055] of JP2016-193869A, the contents of which are hereby incorporated by reference.

On the other hand, the cholesteric alignment can be achieved by adding a chiral agent to the present composition, and it is possible to control the direction of revolution of the cholesteric alignment by its chiral direction.

Incidentally, the pitch of the cholesteric alignment in accordance with the alignment regulating force of the chiral agent may be controlled.

In a case where the present composition includes an alignment control agent, a content thereof is preferably 0.01% to 10% by mass, and more preferably 0.05% to 5% by mass with respect to the mass of the total solid content of the composition. In a case where the content is within the range, it is possible to obtain a uniform and highly transparent cured product, in which precipitation or phase separation, and alignment defects are suppressed while a desired alignment state is achieved.

<Other Components>

The present composition may include components other than the above-mentioned components. Examples of such other components include a liquid crystal compound other than the above-mentioned polymerizable liquid crystal compound and monofunctional compound, a surfactant, a tilt angle control agent, an alignment aid, a plasticizer, and a crosslinking agent.

[Method for Forming Optically Anisotropic Layer]

The optically anisotropic layer is a cured product obtained by curing the above-mentioned present composition and immobilizing the alignment state of the polymerizable liquid crystal compound.

Examples of a method for forming the cured product include a method in which the above-mentioned composition is used to cause a desired alignment state, and then immobilized by polymerization.

Here, the polymerization conditions are not particularly limited, but in the polymerization by irradiation with light, ultraviolet rays are preferably used. The irradiation dose is preferably 10 $mJ/cm^2$ to 50 $J/cm^2$, more preferably 20 $mJ/cm^2$ to 5 $J/cm^2$, still more preferably 30 $mJ/cm^2$ to 3 $J/cm^2$, and particularly preferably 50 to 1,000 $mJ/cm^2$. In addition, the polymerization may be carried out under a heating condition in order to accelerate the polymerization reaction.

In addition, the optically anisotropic layer can be formed on any of supports or alignment films in the optical film which will be described later or a polarizer in the polarizing plate which will be described later.

[Physical Properties of Optically Anisotropic Layer]

The optically anisotropic film of the embodiment of the present invention shows a diffraction peak derived from a periodic structure in X-ray diffraction measurement.

Here, suitable examples of an aspect exhibiting the above-mentioned diffraction peak include an aspect in which molecules adjacent in the direction vertical to the alignment axis forms a layer and this layer is laminated in the direction parallel to the alignment axis, that is, an aspect exhibiting a smectic phase. Further, from the viewpoint that the smectic phase is easily expressed, it is preferable that the polymerizable liquid crystal compound is a compound exhibiting a smectic phase in any of a case where the temperature is elevated and a case where the temperature is lowered.

In addition, whether or not the above-mentioned diffraction peak is exhibited can also be confirmed by observing a texture characteristic of a liquid crystal phase having a periodic structure with a polarizing microscope.

The alignment state of the polymerizable liquid crystal compound in the optically anisotropic layer may be any of horizontal alignment, vertical alignment, tilt alignment, and twist alignment, and it is preferable that the polymerizable liquid crystal compound is immobilized in a state of being horizontally aligned with respect to a main surface of the optically anisotropic layer.

In addition, in the present specification, the "horizontal alignment" means that the main surface of an optically anisotropic layer (or in a case where the optically anisotropic layer is formed on a member such as a support and an alignment film, a surface of the member) and the major axis direction of the polymerizable liquid crystal compound are parallel. Incidentally, it is not required for the both to be strictly parallel, and in the present specification, the expression means that the both are aligned at an angle formed by the major axis direction of the polymerizable liquid crystal compound and the main surface of the optically anisotropic layer of less than 10°.

In the optically anisotropic layer, the angle formed by the major axis direction of the polymerizable liquid crystal compound and the main surface of the optically anisotropic layer is preferably 0 to 5°, more preferably 0 to 3°, and still more preferably 0 to 2°.

The optically anisotropic layer preferably satisfies Expression (V).

$$1.00<Re(450)/Re(550) \quad (V)$$

Here, in Formula (V), Re (450) represents an in-plane retardation at a wavelength of 450 nm of the optically anisotropic layer, and Re(550) represents an in-plane retardation at a wavelength of 550 nm of the optically anisotropic layer. In addition, in the present specification, in a case where the measurement wavelength of the retardation is not specified, the measurement wavelength is 550 nm.

Furthermore, the values of the in-plane retardation (Re) and the thickness-direction retardation (Rth) refer to values measured with light at the measurement wavelength using AxoScan OPMF-1 (manufactured by Opto Science, Inc.).

Specifically, by inputting the average refractive index ((Nx+Ny+Nz)/3) and the film thickness (d(μm)) to AxoScan OPMF-1, it is possible to calculate:

Slow axis direction (°)

$Re(\lambda)=R0(\lambda)$ $Rth(\lambda)=((nx+ny)/2-nz)\times d$.

In addition, $R0(\lambda)$ is expressed in a numerical value calculated with AxoScan OPMF-1, but means $Re(\lambda)$.

In addition, the optically anisotropic layer is preferably a positive A plate or a positive C plate, and more preferably the positive A plate.

Here, the positive A plate (A plate which is positive) and the positive C plate (C plate which is positive) are defined as follows.

In a case where a refractive index in a film in-plane slow axis direction (in a direction in which an in-plane refractive index is maximum) is defined as nx, a refractive index in an in-plane direction orthogonal to the in-plane slow axis is defined as ny, and a refractive index in a thickness direction is defined as nz, the positive A plate satisfies the relationship of Expression (A1) and the positive C plate satisfies the relationship of Expression (C1). In addition, the positive A plate has an Rth showing a positive value and the positive C plate has an Rth showing a negative value.

$$nx > ny \approx nz \quad \text{Expression (A1)}$$

$$nz > nx \approx ny \quad \text{Expression (C1)}$$

Furthermore, the symbol, "≈", encompasses not only a case where the both sides are completely the same as each other but also a case where the both are substantially the same as each other.

In the expression, "substantially the same", with regard to the positive A plate, for example, a case where $(ny-nz)\times d$ (in which d is the thickness of a film) is −10 to 10 nm, and preferably −5 to 5 nm is also included in "ny≈nz", and a case where $(nx-nz)\times d$ is −10 to 10 nm, and preferably −5 to 5 nm is also included in "nx≈nz". In addition, with regard to the positive C plate, for example, a case where $(nx-ny)\times d$ (in which d is the thickness of a film) is 0 to 10 nm, and preferably 0 to 5 nm is also included in "nx≈ny".

In a case where the optically anisotropic layer is a positive A plate, the Re(550) is preferably 100 to 180 nm, more preferably 120 to 160 nm, still more preferably 130 to 150 nm, and particularly preferably 130 to 140 nm, from the viewpoint that the optically anisotropic layer functions as a λ/4 plate.

Here, the "λ/4 plate" is a plate having a λ/4 function, specifically, a plate having a function of converting a linearly polarized light at a certain specific wavelength into a circularly polarized light (or converting a circularly polarized light to a linearly polarized light).

[Optical Film]

The optical film has the optically anisotropic layer.

The structure of the optical film will be described with reference to FIGS. 1A, 1B, and IC (hereinafter simply referred to as "FIG. 1" in a case where it is not necessary to distinguish these drawings). FIG. 1 is a schematic cross-sectional view showing an example of the optical film.

Furthermore, FIG. 1 is a schematic view, and the thicknesses relationship, the positional relationship, and the like among the respective layers are not necessarily consistent with actual ones, and any of the support, the alignment film, and the hardcoat layer shown in FIG. 1 are optional constitutional members.

An optical film 10 shown in FIG. 1 has a support 16, an alignment film 14, and an optically anisotropic layer 12 as the cured product of the present composition in this order.

In addition, the optically anisotropic layer 12 may be a laminate of two or more different optically anisotropic layers. For example, in a case where the polarizing plate which will be described later is used as a circularly polarizing plate or in a case where the optical film is used as an optical compensation film for an IPS mode or an FFS mode liquid crystal display device, the optically anisotropic layer 12 is preferably a laminate of a positive A plate and a positive C plate.

In addition, the optically anisotropic layer may be peeled from the support, and the optically anisotropic layer may be used alone as an optical film.

Hereinafter, various members used for the optical film will be described in detail.

[Optically Anisotropic Layer]

The optically anisotropic layer which is contained in the optical film is the above-mentioned optically anisotropic layer.

In the optical film, a thickness of the optically anisotropic layer is not particularly limited, but is preferably 0.1 to 10 μm, and more preferably 0.5 to 5 μm.

[Support]

The optical film may have a support as a base material for forming an optically anisotropic layer as described above.

Such a support is preferably transparent. Specifically, the light transmittance is preferably 80% or more.

Examples of such a support include a glass substrate and a polymer film. Examples of the material for the polymer film include cellulose-based polymers; acrylic polymers having an acrylic ester polymer such as polymethyl methacrylate and a lactone ring-containing polymer; thermoplastic norbornene-based polymers; polycarbonate-based polymers; polyester-based polymers such as polyethylene terephthalate and polyethylene naphthalate; styrene-based polymers such as polystyrene and an acrylonitrile-styrene copolymer (AS resin); polyolefin-based polymers such as polyethylene, polypropylene, and an ethylene-propylene copolymer; vinyl chloride-based polymers; amide-based polymers such as nylon and aromatic polyamide; imide-based polymers; sulfone-based polymers; polyether sulfone-based polymers; polyether ether ketone-based polymers; polyphenylene sulfide-based polymers; vinylidene chloride-based polymers; vinyl alcohol-based polymers; vinyl butyral-based polymers; arylate-based polymers; polyoxymethylene-based polymers; epoxy-based polymers; and polymers obtained by mixing these polymers.

In addition, an aspect in which a polarizer which will be described later may also function as such a support is also available.

A thickness of the support is not particularly limited, but is preferably 5 to 60 μm, and more preferably 5 to 40 μm.

[Alignment Film]

In the optical film, the optically anisotropic layer is preferably formed on the surface of an alignment film. In a case where the optical film has any of the above-mentioned supports, it is preferable that the alignment film may be sandwiched between the support and the optically anisotropic layer. In addition, an aspect in which the above-mentioned support may also function as an alignment film is also available.

The alignment film may be any film as long as it has a function of horizontally aligning the polymerizable liquid crystal compound included in the composition.

The alignment film often has a polymer as a main component. Polymer materials for the alignment film are described in many documents, and many commercially available products thereof can be used.

As the polymer material for the alignment film, a polyvinyl alcohol, a polyimide, or a derivative thereof is preferable, and a modified or unmodified polyvinyl alcohol is more preferable.

Examples of the alignment film which may be contained in the optical film include the alignment films described for Line 24 on Page 43 to Line 8 on Page 49 of WO01/088574A; the alignment films consisting of modified polyvinyl alcohols described in paragraphs [0071] to [0095] of JP3907735B; and the liquid crystal alignment film formed by a liquid crystal alignment agent described in JP2012-155308A.

Since an object does not come into contact with a surface of the alignment film upon formation of the alignment film and the deterioration of a surface condition can be prevented, it is preferable to use a photo-alignment film as the alignment film.

The photo-alignment film is not particularly limited, but an alignment film formed by the polymer material such as a polyamide compound and a polyimide compound described in paragraphs [0024] to [0043] of WO2005/096041A; a liquid crystal alignment film formed by the liquid crystal alignment agent having a photo-alignment group described in JP2012-155308A; LPP-JP265CP, trade name, manufactured by Rolic Technologies Ltd.; or the like can be used.

A thickness of the alignment film is not particularly limited, but from the viewpoint of forming an optically anisotropic layer having a uniform film thickness by alleviating the surface roughness that can be present on the support, the thickness is preferably 0.01 to 10 μm, more preferably 0.01 to 1 μm, and still more preferably 0.01 to 0.5 μm.

[Ultraviolet Absorber]

The optical film preferably includes an ultraviolet (UV) absorber, taking an effect of external light (particularly ultraviolet rays) into consideration.

The ultraviolet absorber may be included in the optically anisotropic layer or may also be included in a member other than the optically anisotropic layer, constituting the optical film. Suitable examples of the member other than the optically anisotropic layer include a support.

As the ultraviolet absorber, any one of ultraviolet absorbers known in the related art, which can express ultraviolet absorptivity, can be used. Among such the ultraviolet absorbers, a benzotriazole-based or hydroxyphenyltriazine-based ultraviolet absorber is preferable from the viewpoint that it has high ultraviolet absorptivity and ultraviolet absorbing ability (ultraviolet-shielding ability) used for an image display device is obtained.

In addition, in order to broaden ultraviolet absorbing ranges, two or more kinds of ultraviolet absorbers having different maximum absorption wavelengths are also preferably used.

Examples of the ultraviolet absorber include the compounds described in paragraphs [0258] and [0259] of JP2012-018395A and the compounds described in paragraphs [0055] to [0105] of JP2007-072163A.

In addition, as a commercially available product thereof, for example, Tinuvin 400, Tinuvin 405, Tinuvin 460, Tinuvin 477, Tinuvin 479, and Tinuvin 1577 (all manufactured by BASF), or the like can be used.

[Polarizing Plate]

A polarizing plate has the above-mentioned optical film and a polarizer.

In a case where the above-mentioned optically anisotropic layer is a λ/4 plate (positive A plate), the polarizing plate can be used as a circularly polarizing plate.

In a case where the polarizing plate is used as a circularly polarizing plate, the above-mentioned optically anisotropic layer is used as a λ/4 plate (positive A plate), and an angle between the slow axis of the λ/4 plate and the absorption axis of a polarizer which will be described later is preferably 30° to 60°, more preferably 40° to 50°, still more preferably 42° to 48°, and particularly preferably 45°.

Here, the "slow axis" of the λ/4 plate means a direction in which the refractive index in the plane of the λ/4 plate is maximum, and the "absorption axis" of the polarizer means a direction in which the absorbance is highest.

In addition, the polarizing plate can also be used as an optical compensation film for an IPS mode or FFS mode liquid crystal display device.

In a case where the polarizing plate is used as an optical compensation film for an IPS mode or FFS mode liquid crystal display device, it is preferable that the above-mentioned optically anisotropic layer is used as at least one plate of a laminate of a positive A plate and a positive C plate, an angle formed by the slow axis of the positive A plate layer and the absorption axis of a polarizer which will be described later are orthogonal or parallel, and specifically, it is more preferable that an angle formed by the slow axis of the positive A plate layer and the absorption axis of the polarizer which will be described later is 0° to 5° or 85° to 95°.

In a case where the polarizing plate is used in a liquid crystal display device which will be described later, it is preferable that an angle formed by the slow axis of the optically anisotropic layer and the absorption axis of a polarizer which will be described later is parallel or orthogonal.

In addition, in the present specification, a term "parallel" does not require that the both are strictly parallel, but means that an angle between one and the other is less than 10°. In addition, in the present specification, a term "orthogonal" does not require that the both are strictly orthogonal, but means that the angle between one and the other is more than 80° and less than 100°.

[Polarizer]

The polarizer contained in the polarizing plate is not particularly limited as long as it is a member having a function of converting light into specific linearly polarized light, and an absorptive type polarizer and a reflective type polarizer, which are known in the related art, can be used.

An iodine-based polarizer, a dye-based polarizer using a dichroic dye, a polyene-based polarizer, or the like is used as the absorptive type polarizer. The iodine-based polarizer and the dye-based polarizer are classified into a coating type polarizer and a stretching type polarizer, any of which can be applied, but a polarizer which is manufactured by allowing polyvinyl alcohol to adsorb iodine or a dichroic dye and performing stretching is preferable.

In addition, examples of a method of obtaining a polarizer by carrying out stretching and dying in a state of a laminated film in which a polyvinyl alcohol layer is formed on a base material include the methods disclosed in JP5048120B, JP5143918B, JP4691205B, JP4751481B, and JP4751486B, and known technologies relating to these polarizers can also be preferably used.

Examples of the coating type polarizer include those in WO2018/124198A, WO2018/186503A, WO2019/

132020A, WO2019/132018A, WO2019/189345A, JP2019-197168A, JP2019-194685A, and JP2019-139222A, and known techniques relating to these polarizers can also be preferably used.

A polarizer in which thin films having different birefringence are laminated, a wire grid-type polarizer, a polarizer having a combination of a cholesteric liquid crystal having a selective reflection range, a ¼ wavelength plate, and the like is used as the reflective type polarizer.

Among those, a polymer containing a polyvinyl alcohol-based resin (—$CH_2$—CHOH— as a repeating unit) from the viewpoint that it has more excellent adhesiveness. In particular, a polarizer containing at least one selected from the group consisting of polyvinyl alcohol and an ethylene-vinyl alcohol copolymer) is preferable.

In addition, from the viewpoint of imparting crack resistance, the polarizer may have a depolarization unit formed along the opposite end edges. Examples of the depolarization unit include JP2014-240970A.

In addition, the polarizer may have non-polarizing parts arranged at predetermined intervals in the longitudinal direction and/or the width direction. The non-polarizing part is a decolorized part which is partially decolorized. The arrangement pattern of the non-polarizing parts can be appropriately set according to a purpose. For example, the non-polarizing parts are arranged at a position corresponding to a camera unit of an image display device in a case where a polarizer is cut (cut, punched, or the like) to a predetermined size in order to be attached to the image display device in a predetermined size. Examples of the arrangement pattern of the non-polarizing parts include those in JP2016-027392A.

A thickness of the polarizer is not particularly limited, but is preferably 3 to 60 μm, more preferably 3 to 30 μm, and still more preferably 3 to 10 μm.

[Pressure Sensitive Adhesive Layer]

In the polarizing plate, a pressure sensitive adhesive layer may be arranged between the optically anisotropic layer in the optical film and the polarizer.

Examples of a material forming the pressure sensitive adhesive layer used for lamination of the cured product and the polarizer include a member formed of a substance in which a ratio (tan δ=G"/G') between a storage elastic modulus G' and a loss elastic modulus G", each measured with a dynamic viscoelastometer, is 0.001 to 1.5, in which a so-called pressure sensitive adhesive and a readily creepable substance is included. Examples of the pressure sensitive adhesive include a polyvinyl alcohol-based pressure sensitive adhesive, but the pressure sensitive adhesive is not limited thereto.

[Adhesive Layer]

In the polarizing plate, an adhesive layer may be arranged between the optically anisotropic layer in the optical film and the polarizer.

As the adhesive layer used for laminating a cured product and a polarizer, a curable adhesive composition that is cured by irradiation with active energy rays or heating is preferable.

Examples of the curable adhesive composition include a curable adhesive composition containing a cationically polymerizable compound and a curable adhesive composition containing a radically polymerizable compound.

A thickness of the adhesive layer is preferably 0.01 to 20 μm, more preferably 0.01 to 10 μm, and still more preferably 0.05 to 5 μm. In a case where the thickness of the adhesive layer is within this range, floating or peeling does not occur between the protective layer or optically anisotropic layer and the polarizer, which are laminated, and a practically acceptable adhesive force can be obtained. In addition, the thickness of the adhesive layer is preferably 0.4 μm or more from the viewpoint that the generation of air bubbles can be suppressed.

Moreover, from the viewpoint of durability, a bulk water absorption rate of the adhesive layer may be adjusted to 10% by mass or less, and is preferably 2% by mass or less. The bulk water absorption rate is measured according to the water absorption rate testing method described in JIS K 7209.

With regard to the adhesive layer, reference can be made to the description in paragraphs to of JP2016-035579A, the contents of which are incorporated herein by reference.

[Easy Adhesion Layer]

In the polarizing plate, an easy adhesion layer may be arranged between the optically anisotropic layer in the optical film and the polarizer. A storage elastic modulus of the easy adhesion layer at 85° C. is preferably $1.0\times10^6$ Pa to $1.0\times10^7$ Pa from the viewpoints that the adhesiveness between the optically anisotropic layer and the polarizer is excellent and the generation of cracks in the polarizer is suppressed. Examples of the constituent material of the easy adhesion layer include a polyolefin-based component and a polyvinyl alcohol-based component. A thickness of the easy adhesion layer is preferably 500 nm to 1 μm.

With regard to the easy adhesion layer, reference can be made to the description in paragraphs to of JP2018-036345A, the contents of which are incorporated herein by reference.

[Image Display Device]

The image display device is an image display device having the optical film or the polarizing plate.

A display element used in the image display device is not particularly limited, and examples thereof include a liquid crystal cell, an organic electroluminescent (hereinafter simply referred to as "electroluminescence (EL)") display panel, and a plasma display panel. Among those, the liquid crystal cell or the organic EL display panel is preferable, and the liquid crystal cell is more preferable.

That is, as the image display device, a liquid crystal display device using a liquid crystal cell as a display element or an organic EL display device using an organic EL display panel as a display element is preferable, and the liquid crystal display device is more preferable.

[Liquid Crystal Display Device]

A liquid crystal display device which is an example of the image display device is a liquid crystal display device having the above-mentioned polarizing plate and a liquid crystal cell.

Furthermore, it is preferable that the above-mentioned polarizing plate is used as the polarizing plate of the front side, and it is more preferable that the above-mentioned polarizing plate is used as the polarizing plates on both sides of the front and rear sides, among the polarizing plates provided on the both sides of the liquid crystal cell.

Hereinafter, the liquid crystal cell constituting the liquid crystal display device will be described in detail.

<Liquid Crystal Cell>

The liquid crystal cell used in the liquid crystal display device is a vertical alignment (VA) mode, an optically compensated bend (OCB) mode, an in-plane-switching (IPS) mode, a fringe-field-switching (FFS) mode, or a twisted nematic (TN) mode is preferred, but is not limited to these.

In a TN-mode liquid crystal cell, rod-shaped liquid crystal molecules are substantially horizontally aligned and are twist-aligned at 60° to 120° during no voltage application thereto. A TN-mode liquid crystal cell is most often used in a color TFT liquid crystal display device and described in numerous documents.

In a VA-mode liquid crystal cell, rod-shaped liquid crystal molecules are substantially vertically aligned during no voltage application thereto. Examples of the VA-mode liquid crystal cell include (1) a VA-mode liquid crystal cell in the narrow sense of the word, in which rod-shaped liquid crystal molecules are substantially vertically aligned during no voltage application thereto, but are substantially horizontally aligned during voltage application thereto (described in JP1990-176625A (JP-H02-176625A)), (2) an MVA-mode liquid crystal cell in which the VA-mode is multi-domained for viewing angle enlargement (described in SID97. Digest of tech. Papers (preprint), 28 (1997) 845), (3) a liquid crystal cell in a mode (n-ASM mode) in which rod-shaped liquid crystal molecules are substantially vertically aligned during no voltage application thereto and are multi-domain-aligned during voltage application thereto (described in Seminar of Liquid Crystals of Japan, Papers (preprint), 58-59 (1998)), and (4) a survival-mode liquid crystal cell (announced in LCD International 98). In addition, the liquid crystal cell in the VA mode may be any of a patterned vertical alignment (PVA) type, an optical alignment type, and a polymer-sustained alignment (PSA) type. Details of these modes are specifically described in JP2006-215326A and JP2008-538819A.

In an IPS-mode liquid crystal cell, rod-shaped liquid crystal molecules are aligned substantially parallel with respect to a substrate, and application of an electric field parallel to the substrate surface causes the liquid crystal molecules to respond planarly. The IPS-mode displays black in a state where no electric field is applied and a pair of upper and lower polarizing plates have absorption axes which are orthogonal to each other. A method of improving the viewing angle by reducing light leakage during black display in an oblique direction using an optical compensation sheet is disclosed in JP1998-054982A (JP-H10-054982A), JP1999-202323A (JP-H11-202323A), JP1997-292522A (JP-H09-292522A), JP1999-133408A (JP-H11-133408A), JP1999-305217A (JP-H11-305217A), JP1998-307291A (JP-H10-307291A), and the like.

[Organic EL Display Device]

Examples of the organic EL display device which is an example of the image display device include an aspect which includes, from the visible side, a polarizer, a N4 plate (a positive A plate) including the above-mentioned optically anisotropic layer, and an organic EL display panel in this order.

Furthermore, the organic EL display panel is a display panel composed of an organic EL device in which an organic light emitting layer (organic electroluminescent layer) is sandwiched between electrodes (between a cathode and an anode). The configuration of the organic EL display panel is not particularly limited but a known configuration is adopted.

EXAMPLES

Hereinbelow, the present invention will be described in more detail with reference to Examples. The materials, the amounts of materials used, the proportions, the treatment details, and the treatment procedure shown in Examples below can be appropriately modified as long as the modifications do not depart from the spirit of the present invention. Therefore, the scope of the present invention should not be construed as being limited to Examples shown below.

Example 1

[Manufacture of Protective Film 1]

<Preparation of Core Layer Cellulose Acylate Dope 1>

The following composition was put into a mixing tank and stirred to dissolve the respective components to prepare a core layer cellulose acylate dope 1.

| Core layer cellulose acylate dope 1 | |
|---|---|
| Cellulose acetate having a degree of acetyl substitution of 2.88 | 100 parts by mass |
| The following polyester | 12 parts by mass |
| The following durability improver | 4 parts by mass |
| Methylene chloride (the first solvent) | 430 parts by mass |
| Methanol (the second solvent) | 64 parts by mass |

Polyester (number-average molecular weight of 800)

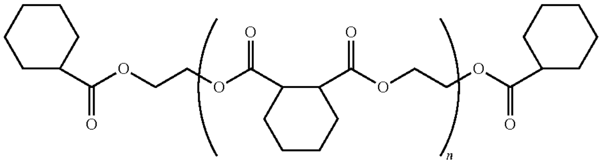

Durability improver

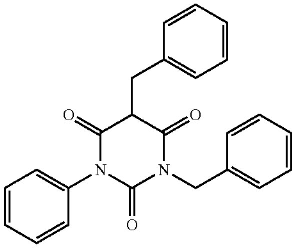 [SMILES: O=C1C(Cc2ccccc2)C(=O)N(c2ccccc2)C(=O)N1Cc1ccccc1]

<Preparation of Outer Layer Cellulose Acylate Dope 1>

10 parts by mass of the following matting agent dispersion liquid 1 was added to 90 parts by mass of the core layer cellulose acylate dope 1 to prepare an outer layer cellulose acylate dope 1.

| Matting agent dispersion liquid 1 | |
|---|---|
| Silica particles with an average particle size of 20 nm (AEROSIL R972, manufactured by Nippon Aerosil Co., Ltd.) | 2 parts by mass |
| Methylene chloride (the first solvent) | 76 parts by mass |
| Methanol (the second solvent) | 11 parts by mass |
| Core layer cellulose acylate dope 1 | 1 part by mass |

<Manufacture of Protective Film 1>

The core layer cellulose acylate dope 1 and the outer layer cellulose acylate dope 1 were filtered, using a filter paper with an average pore diameter of 34 μm and a sintered metal filter with an average pore diameter of 10 μm. Then, the core layer cellulose acylate dope 1 and the outer layer cellulose acylate dopes 1 on both sides thereof were cast simultaneously on a drum at 20° C. from a casting port in three layers, using a band casting machine.

Subsequently, the film was peeled from the drum in a state where a solvent content of the film on the drum was approximately 20% by mass. Both ends of the obtained film in the width direction were fixed with tenter clips, and the film was dried while being stretched 1.1 times in the width direction in a state where the solvent content of the film was 3% to 15% by mass.

Then, the obtained film was transported between rolls of a heat treatment device and further dried to manufacture a cellulose acylate film 1 with a film thickness of 40 μm, which was used as a protective film 1. The results of measuring a phase difference of the protective film 1 were as follows: Re=1 nm and Rth=−5 nm.

[Manufacture of Optically Anisotropic Layer 1]

<Preparation of Composition 1 for Photo-Alignment Film>

8.4 parts by mass of the following copolymer C3 and 0.3 parts by mass of the following thermal acid generator D1 were added to a mixed liquid including 80 parts by mass and 20 parts by mass of butyl acetate and methyl ethyl ketone, respectively, to prepare a composition 1 for a photo-alignment film.

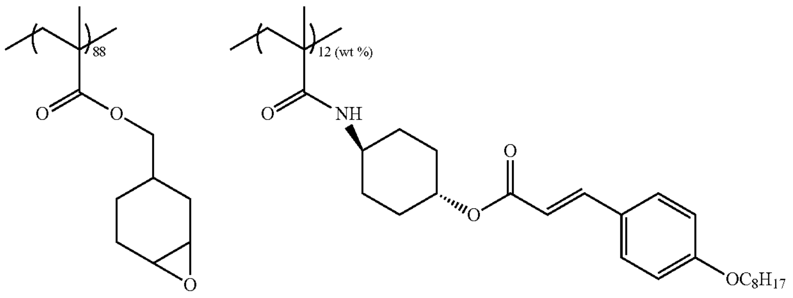

Copolymer C3 (weight-average molecular weight of 40,000)

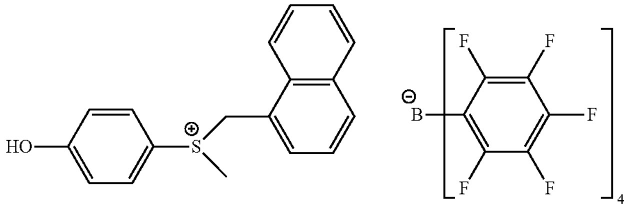

Thermal acid generator D1

<Formation of Photo-Alignment Film 1>

The composition 1 for the photo-alignment film prepared in advance was applied onto a surface on one side of the manufactured protective film 1, using a bar coater. Then, the film was dried on a hot plate at 80° C. for 5 minutes to remove the solvent, thereby forming a photoisomerization composition layer with a thickness of 0.2 μm. The obtained photoisomerization composition layer was irradiated with polarized ultraviolet rays (10 $mJ/cm^2$, using an ultra-high-pressure mercury lamp) to form a photo-alignment film 1 with a thickness of 0.2 μm.

<Manufacture of Optically Anisotropic Layer 1>

The following composition 1 (polymerizable liquid crystal composition) was applied to a surface of the photo-alignment film 1, using a bar coater. The coating film formed on the surface of the photo-alignment film 1 was heated to a temperature exhibiting a nematic phase with warm air, and then cooled to a temperature exhibiting a smectic phase to stabilize the alignment. Then, the coating film was irradiated with ultraviolet rays (wavelength of 365 nm, irradiation amount of 500 $mJ/cm^2$) using a high-pressure mercury lamp under a nitrogen atmosphere to immobilize the alignment of the polymerizable liquid crystal compound, thereby manufacturing an optically anisotropic layer 1 with a thickness of 2 μm.

In a case where the obtained optically anisotropic layer 1 was peeled from the protective film 1 and a phase difference of the optically anisotropic layer 1 was measured, the in-plane retardation Rel(550) was 130 nm and Rel(450)/Rel (550) was 1.05.

| (Composition 1) | | |
|---|---|---|
| The following polymerizable liquid crystal compound L-1 | 100.00 | parts by mass |
| The following monofunctional compound M-1 | 15.00 | parts by mass |
| The following polymerization initiator PI-1 | 0.50 | parts by mass |
| The following leveling agent T-1 | 0.20 | parts by mass |
| Cyclopentanone | 235.00 | parts by mass |

Polymerizable liquid crystal compound L-1

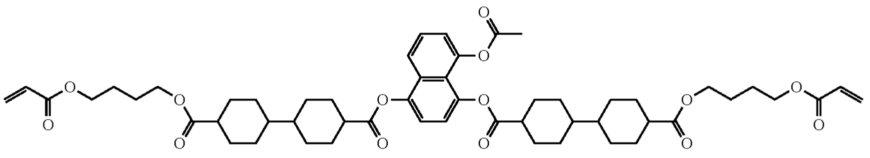 [SMILES: C=CC(=O)OCCCCOC(=O)C1CCC(C2CCC(C(=O)Oc3ccc(OC(=O)C4CCC(C5CCC(C(=O)OCCCCOC(=O)C=C)CC5)CC4)c4c(OC(C)=O)cccc34)CC2)CC1]

-continued (Composition 1)

Monofunctional compound M-1

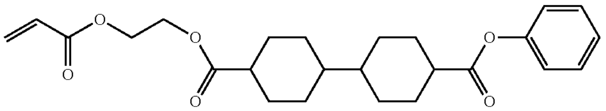 [SMILES: C=CC(=O)OCCOC(=O)C1CCC(C2CCC(C(=O)Oc3ccccc3)CC2)CC1]

Polymerization initiator PI-1

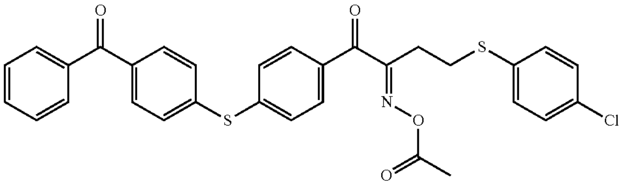 [SMILES: CC(=O)O/N=C(\CCSc1ccc(Cl)cc1)C(=O)c1ccc(Sc2ccc(C(=O)c3ccccc3)cc2)cc1]

Leveling agent T-1 ("32.5" and "67.5" in the following formula represent contents (% by mass) of the respective repeating unit with respect to all repeating units in the leveling agent T-1).

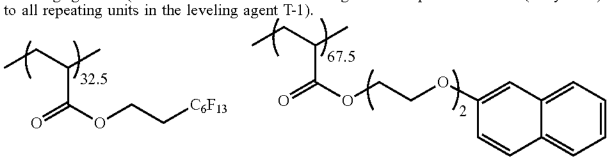

[Evaluation]

<X-Ray Diffraction Measurement>

For the optically anisotropic layer 1 formed on the surface of the photo-alignment film 1, X-ray diffraction measurement was performed using the following equipment under the following conditions, and it was confirmed whether diffracted light derived from the order (periodic structure) of the smectic phase was observed and evaluated according to the following standard.

As a result, in the optically anisotropic layer 1, a peak showing a periodic structure was observed at $2\theta=2.09°$, and diffracted light derived from the order of the smectic phase was confirmed.

(Apparatus and Conditions)

X-ray diffractometer ATXG (model name, for evaluation of a thin film structure, manufactured by Rigaku), Cu source (50 kV·300 mA), 0.45 solar slit (Evaluation Standard)

A: Diffraction peaks derived from the periodic structure of the smectic phase are observed.

B: No diffraction peak derived from the periodic structure of the smectic phase is observed.

<Contrast>

Measurement of a contrast was performed with a laminate in which a direct-type LED backlight light source, a lower polarizing plate, the manufactured optically anisotropic layer 1, and an upper polarizing plate were arranged on a table in order from the bottom so that the respective surfaces were parallel. At this time, the optically anisotropic layer 1 and the upper polarizing plate were made rotatable.

A luminance of the light emitted from the light source and transmitted through the lower polarizing plate, the optically anisotropic layer 1, and the upper polarizing plate in this order was measured from the direction perpendicular to the main surface of each polarizing plate and the optically anisotropic layer 1, using a luminance meter (BM-5A (manufactured by TOPCON)).

Measurement of the luminance was performed as follows. First, the upper polarizing plate was rotated in the absence of the optically anisotropic layer 1 and adjusted to a position where the luminance was the darkest (a state of crossed nicols). The optically anisotropic layer 1 was inserted, and the optically anisotropic layer 1 was rotated in the state of crossed nicols to measure a luminance which reached a minimum value. Next, the upper polarizing plate was rotated to arrange the upper polarizing plate and the lower polarizing plate under the state of parallel nicols, and then the optically anisotropic layer 1 was rotated under the state of parallel nicols to measure a luminance which reached a maximum value.

In order to eliminate the contribution of luminance leakage caused by the upper polarizing plate and the lower polarizing plate, a value obtained by the following expression was defined as a contrast of the optically anisotropic layer 1 and evaluated according to the following standard. The results are shown in Table 1 below.

Contrast=1/[{(Minimum luminance under crossed nicols in a case where the optically anisotropic layer 1 is arranged)/(Maximum luminance in the alignment of parallel nicols in a case where the optically anisotropic layer 1 is arranged)}−{(Minimum luminance under crossed nicols in the absence of the optically anisotropic layer 1)/(Maximum luminance in the alignment of parallel nicols in the absence of the optically anisotropic layer 1)}]

(Evaluation Standard)

A: The contrast is 200,000 or more

B: The contrast is 100,000 or more and less than 200,000.

C: The contrast is less than 100,000

<Defects>

For the manufactured optically anisotropic layer 1, observation with a polarizing microscope and visual observation of a laminate obtained by inserting the optically anisotropic layer 1 between two polarizing plates arranged in the state of crossed nicols were each performed, and the defects of the optically anisotropic layer 1 were evaluated according to the following standard.

(Evaluation Standard)

A: By observation with the polarizing microscope, disturbance of a liquid crystal director can hardly be confirmed B: By observation with the polarizing microscope, disturbance of a liquid crystal director can be slightly confirmed, but by visual observation, defects caused by misalignment cannot be confirmed C: By observation with the polarizing microscope, disturbance of a liquid crystal director can be slightly confirmed, but by visual observation, defects caused by misalignment cannot be confirmed D: By visual observation, defects caused by misalignment can be confirmed, which is unacceptable Examples 2 to 12

Optically anisotropic layers 2 to 12 were manufactured according to the method of Example 1, except that a combination of a polymerizable liquid crystal compound and a monofunctional compound shown in Table 1 which will be described later was used instead of the polymerizable liquid crystal compound L-1 and/or the monofunctional compound M-1 included in the composition 1, and each evaluation was performed.

Furthermore, in a case where the phase differences of the optically anisotropic layers 2 to 12 formed in Examples 2 to 12 were measured in the same manner as in Example 1, it was confirmed that all of the optically anisotropic layers 2 to 12 were positive A plates, the in-plane retardation Rel(550) was 110 to 150 nm, and Rel(450)/Rel(550) was 1.02 to 1.12.

Comparative Examples 1 to 7

Similarly, optically anisotropic layers 13 to 19 of Comparative Examples 1 to 7 were manufactured according to the method of Example 1, except that a combination of a polymerizable liquid crystal compound and a monofunctional compound shown in Table 1 which will be described later was used instead of the polymerizable liquid crystal compound L-1 and/or the monofunctional compound M-1 included in the composition 1, and each evaluation was performed.

Comparative Example 8

An optically anisotropic layer 20 of Comparative Example 8 was manufactured according to the method of Example 1, except that in the manufacture of the optically anisotropic layer 1, the alignment of the coating film formed by applying the composition 1 was stabilized at a temperature exhibiting a nematic phase, and then the alignment was immobilized by irradiation with ultraviolet rays, and each evaluation was performed.

The polymerizable liquid crystal compounds L-2 to L-6 and the monofunctional compounds M-1 to M-14 used in each Example and each Comparative Example are shown below.

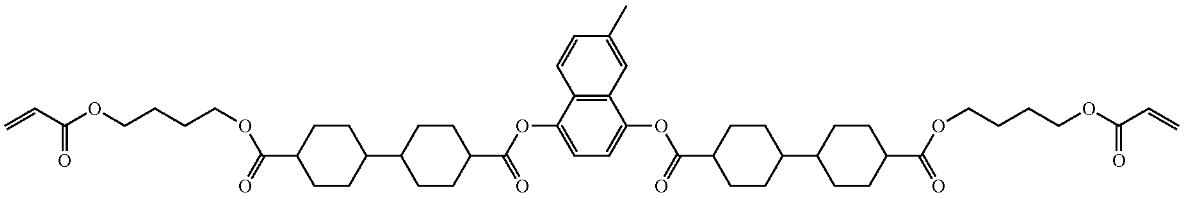

Polymerizable liquid crystal compound L-2

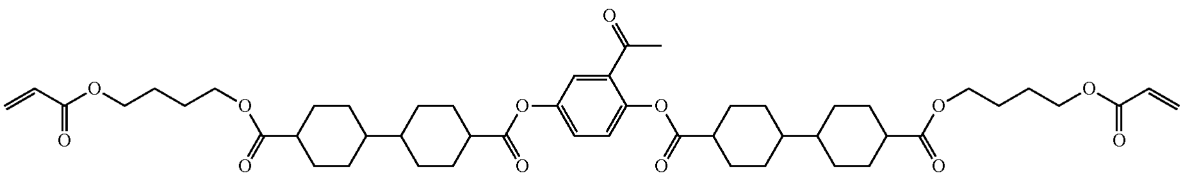

Polymerizable liquid crystal compound L-3

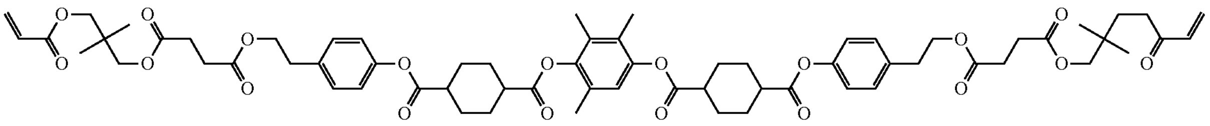

Polymerizable liquid crystal compound L-4

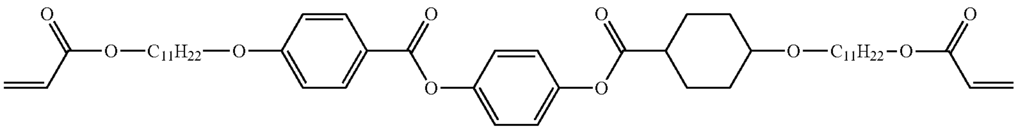

Polymerizable liquid crystal compound L-5

-continued
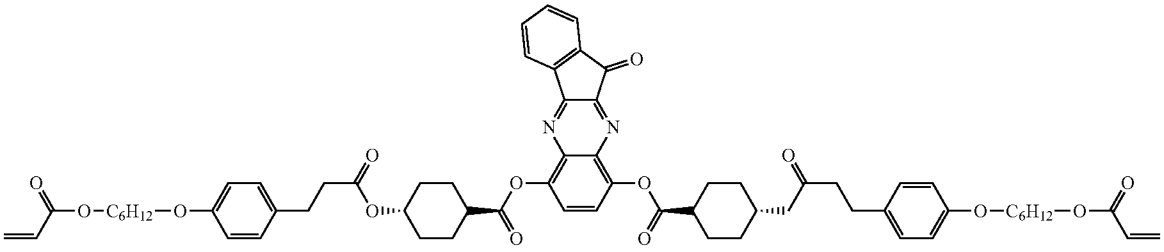
Polymerizable liquid crystal compound L-6
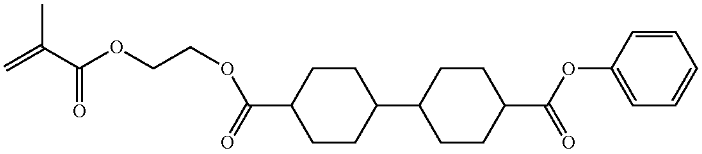
Monofunctional compound M-2
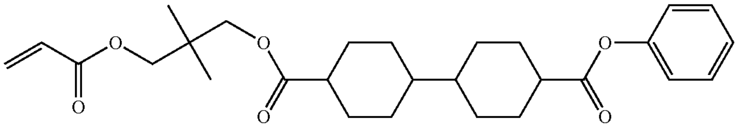
Monofunctional compound M-3
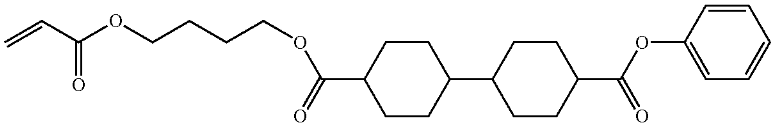
Monofunctional compound M-4
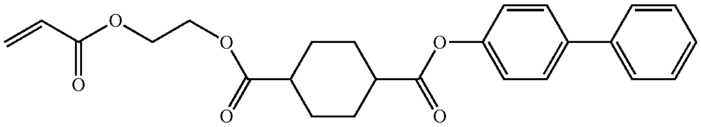
Monofunctional compound M-5
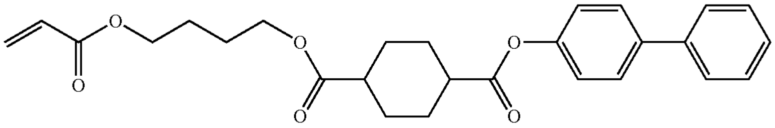
Monofunctional compound M-6
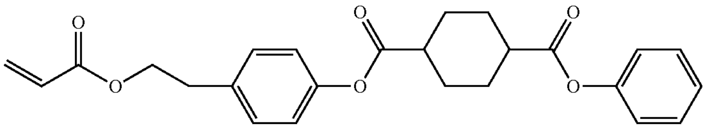
Monofunctional compound M-7
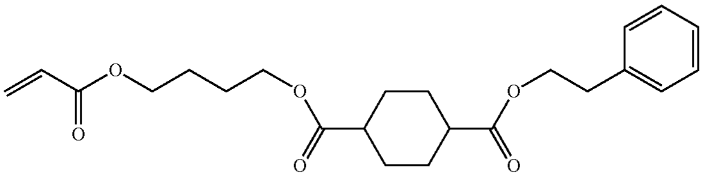
Monofunctional compound M-8

-continued

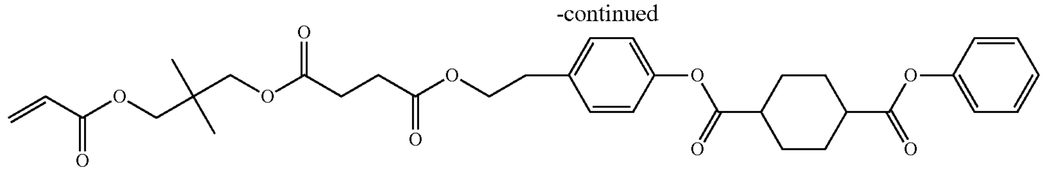

Monofunctional compound M-9

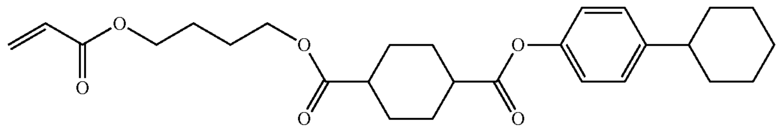

Monofunctional compound M-10

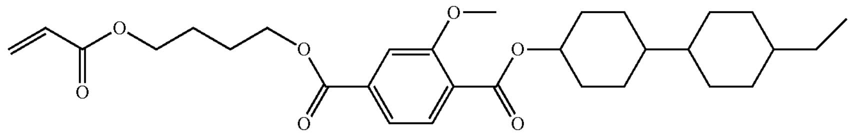

Monofunctional compound M-11

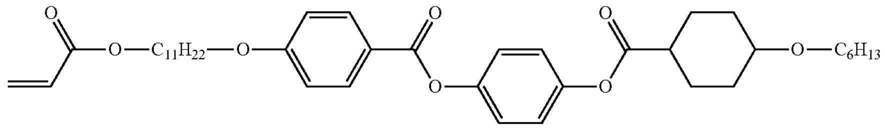

Monofunctional compound M-12

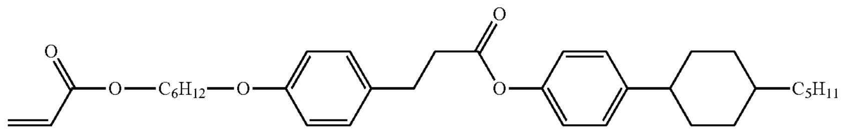

Monofunctional compound M-13

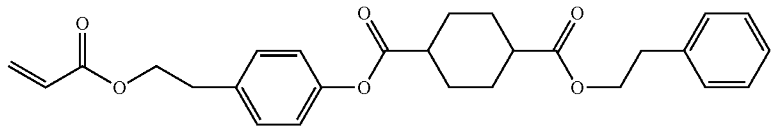

Monofunctional compound M-14

[Evaluation Results]

The composition of the polymerizable liquid crystal composition used for forming the optically anisotropic layer in each of Examples 1 to 12 and Comparative Examples 1 to 8, and the evaluation results of the X-ray diffraction measurement, the contrast, and the defects of an optically anisotropic layer thus formed are each shown in Table 1 below.

In Table 1, the "ratio $a_2/a_1$" column shows a ratio of the number $a_2$ of atoms of the monofunctional compound to the number $a_1$ of atoms of the polymerizable liquid crystal compound in each Example and each Comparative Example.

In addition, in each Example and each Comparative Example, a case where the number $b_1$ of the rings $B^1$ contained in the polymerizable liquid crystal compound and the total number $b_2$ of the rings $B^2$ and the aromatic rings Ar contained in the monofunctional compound satisfy a relationship of Expression (2) is notated as "A" in the "Expression (2)" column of Table 1, and a case where the numbers do not satisfy the relationship of Expression (2) is notated as "B" in the same column.

TABLE 1

| | Composition of polymerizable liquid crystal composition | | | | | | | | | | | Evaluation results | | |
|---|---|---|---|---|---|---|---|---|---|---|---|---|---|---|
| | | Polymerizable liquid crystal compound | | | | Monofunctional compound | | | | | | | | |
| | Optically anisotropic layer | No. | Number $a_1$ of atoms | Number $b_1$ of rings | Number of π electrons. | No. | Number $a_2$ of atoms | Number $b_2$ of rings | Ratio $a_2/a_1$ | Expression (2) | X-ray diffraction measurement | Contrast | Defects |
| Example 1 | 1 | L-1 | 44 | 5 | 10 | M-1 | 22 | 3 | 0.500 | A | A | A | A |
| Example 2 | 2 | L-1 | 44 | 5 | 10 | M-2 | 22 | 3 | 0.500 | A | A | A | A |
| Example 3 | 3 | L-1 | 44 | 5 | 10 | M-3 | 22 | 3 | 0.500 | A | A | A | A |
| Example 4 | 4 | L-1 | 44 | 5 | 10 | M-4 | 24 | 3 | 0.545 | A | A | A | B |
| Example 5 | 5 | L-2 | 44 | 5 | 10 | M-1 | 22 | 3 | 0.500 | A | A | A | A |
| Example 6 | 6 | L-1 | 44 | 5 | 10 | M-5 | 22 | 3 | 0.500 | A | A | B | C |
| Example 7 | 7 | L-1 | 44 | 5 | 10 | M-6 | 24 | 3 | 0.545 | A | A | B | C |
| Example 8 | 8 | L-3 | 44 | 5 | 6 | M-1 | 22 | 3 | 0.500 | A | A | B | B |
| Example 9 | 9 | L-4 | 56 | 5 | 6 | M-7 | 22 | 3 | 0.393 | A | A | B | B |
| Example 10 | 10 | L-5 | 48 | 3 | 6 | M-8 | 22 | 2 | 0.458 | A | A | B | C |
| Example 11 | 11 | L-6 | 54 | 5 | 10 | M-7 | 22 | 3 | 0.407 | A | A | A | C |
| Example 12 | 12 | L-4 | 56 | 5 | 6 | M-14 | 24 | 3 | 0.429 | A | A | B | C |
| Comparative Example 1 | 13 | L-1 | 44 | 5 | 10 | — | — | — | — | — | A | C | D |
| Comparative Example 2 | 14 | L-1 | 44 | 5 | 10 | M-8 | 22 | 2 | 0.500 | B | A | C | D |
| Comparative Example 3 | 15 | L-1 | 44 | 5 | 10 | M-9 | 30 | 3 | 0.682 | A | A | C | D |
| Comparative Example 4 | 16 | L-1 | 44 | 5 | 10 | M-10 | 24 | 3 | 0.545 | A | A | C | D |
| Comparative Example 5 | 17 | L-4 | 56 | 5 | 6 | M-11 | 26 | 3 | 0.464 | A | A | C | C |
| Comparative Example 6 | 18 | L-5 | 48 | 3 | 6 | M-12 | 39 | 3 | 0.813 | B | A | C | D |
| Comparative Example 7 | 19 | L-6 | 54 | 5 | 10 | M-13 | 32 | 3 | 0.593 | A | A | C | D |
| Comparative Example 8 | 20 | L-1 | 44 | 5 | 10 | M-1 | 22 | 3 | 0.500 | A | B | C | C |

From the results shown in Table 1 above, it was found that in a case where an optically anisotropic layer was formed using a polymerizable liquid crystal composition containing no monofunctional compound, the contrast of an image display device was deteriorated (Comparative Example 1).

Furthermore, it was found that in a case where a ratio of the number $b_1$ of the rings $B^1$ of the polymerizable liquid crystal compound to the number $b_2$ of the rings $B^2$ of the monofunctional compound does not satisfy the relationship of Expression (2), the contrast of an image display device is deteriorated (Comparative Examples 2 and 6).

Moreover, it was found that in a case where a ratio of the number $a_1$ of atoms of the polymerizable liquid crystal compound and the number $a_2$ of atoms of the monofunctional compound does not satisfy the relationship of Expression (1), the contrast of an image display device is deteriorated (Comparative Examples 3, 6, and 7).

Furthermore, it was also found that in a case where the monofunctional compound has no aromatic ring which may have a substituent at a terminal, the contrast of an image display device is deteriorated (Comparative Examples 4 and 5).

In addition, it was found that in a case where the optically anisotropic layer does not show a diffraction peak derived from a periodic structure in the X-ray diffraction measurement, the contrast of an image display device is deteriorated (Comparative Example 8).

In contrast, it was found that in a case where the polymerizable liquid crystal composition includes a monofunctional compound having a specific polymerizable group and an aromatic ring group, and the polymerizable liquid crystal compound and the monofunctional compound included in the polymerizable liquid crystal composition satisfy both of Expression (1) and Expression (2), by forming an optically anisotropic layer using the polymerizable liquid crystal composition, the contrast of an image display device thus obtained is good (Examples 1 to 12).

In particular, it was confirmed that in a case where the array of the rings consisting of the rings $B^2$ and the rings Ar arranged in order from the polymerizable group $P^3$ in the monofunctional compound is the same as the array of the ring $B^1$ arranged in order from the polymerizable group $P^1$ or $P^2$ in the polymerizable liquid crystal compound, the contrast of an image display device is better and an effect of suppressing defects in the optically anisotropic layer is good (comparison between Examples 1 to 3 and 5, and Examples 6 and 7).

In addition, it was confirmed that in a case where the polymerizable liquid crystal compound has five rings $B^1$, the contrast of an image display device is more excellent and an effect of suppressing the defects of an optically anisotropic layer is good, as compared with a case where the polymerizable liquid crystal compound has three rings $B^1$ (comparison between Examples 1 to 3 and 5, and Example 10).

Furthermore, it was confirmed that in a case where the monofunctional compound has two rings $B^2$, the contrast of an image display device is more excellent and an effect of suppressing the defects of an optically anisotropic layer is good, as compared with a case where the monofunctional compound has one ring $B^2$ (comparison between Examples 1 to 3 and 5, and Example 10).

Moreover, in the polymerizable liquid crystal compound represented by Formula (I), it was confirmed that in a case where the aromatic ring represented by $Ar^3$ has 10 or more π-electrons, the contrast of an image display device is more excellent and an effect of suppressing the defects of an optically anisotropic layer is good, as compared with a case where of the aromatic ring represented by $Ar^3$ has 6 π-electrons (comparison between Examples 1 to 3 and 5, and Examples 8 and 10).

Furthermore, in the polymerizable liquid crystal compound represented by Formula (I), it was confirmed that in a case where the aromatic ring represented by $Ar^3$ is the aromatic ring represented by Formula (III), an effect of suppressing defects in an optically anisotropic layer is good, as compared with a case where the aromatic ring represented by $Ar^3$ is not represented by Formula (III) (comparison between Examples 1 to 3 and 5, and Example 11).

Moreover, it was confirmed that in a case where the ratio $a_2/a_1$ of the number $a_2$ of atoms of the monofunctional compound to the number $a_1$ of atoms of the polymerizable liquid crystal compound is less than 0.53, an effect of suppressing defects in an optically anisotropic layer is good, as compared with a case where the ratio $a_2/a_1$ is 0.53 or more (comparison between Examples 1 to 3 and 5 and Example 4).

In addition, it was confirmed that in a case where the structure of the portion W2 in the monofunctional compound is the same as the structure of the portion W1 in the polymerizable liquid crystal compound, an effect of suppressing defects in an optically anisotropic layer is good, as compared with a case where the structure of the portion W2 in the monofunctional compound is different from the structure of the portion W1 in the polymerizable liquid crystal compound (comparison between Example 9 and Example 12).

EXPLANATION OF REFERENCES

10: optical film
12: optically anisotropic layer
14: alignment film
16: support

What is claimed is:

1. An optically anisotropic layer obtained by curing a polymerizable liquid crystal composition including a polymerizable liquid crystal compound having forward wavelength dispersion and a monofunctional compound, in an alignment state of the polymerizable liquid crystal compound, wherein the polymerizable liquid crystal compound is a compound represented by Formula (I), $$P^1\text{-}Sp^1\text{-}(X^1—Ar^1)_{n1}—(X^2\text{-}Cy^1)_{m1}\text{-}X^3—Ar^3—X^4—(Cy^2\text{-}X^5)_{m2}—(Ar^2—X^6)_{n2}\text{-}Sp^2\text{-}P^2 \quad (I)$$

in Formula (I), $P^1$ and $P^2$ each independently represent an acryloyloxy group or a methacryloyloxy group, wherein $P^1$ includes a first terminal atom and $P^2$ includes a second terminal atom of the polymerizable liquid crystal compound represented by Formula (I), wherein the first terminal atom of the polymerizable liquid crystal compound is a starting atom and the second terminal atom of the polymerizable liquid crystal compound represented by Formula (I) is an ending atom utilized to calculate a maximum number of atoms linked together at a shortest distance to form the polymerizable liquid crystal compound represented by Formula (I), wherein the maximum number of atoms linked together at a shortest distance to form the polymerizable liquid crystal compound represented by Formula (I) is counted such that the starting atom and the ending atom are also counted;

$Sp^1$ and $Sp^2$ each independently represent a single bond, a linear alkylene group having 1 to 14 carbon atoms, a branched alkylene group having 3 to 14 carbon atoms, or a divalent linking group in which one or more of $—CH_2$-s constituting the linear alkylene group or the branched alkylene group are substituted with —O—, —S—, —NH—, —N(Q)-, or —CO—, where Q represents a substituent, n1, m1, m2, and n2 each represent an integer from 0 to 4, and a sum of n1, m1, m2, and n2 is 4, $X^1$, $X^2$, $X^3$, $X^4$, $X^5$, and $X^6$ each independently represent a single bond; or —CO—, —O—, —S—, —C(=S)—, $—CR^1R^2—$, $—CR^3{=}CR^4—$, $—NR^5$, or a divalent linking group consisting of a combination of two or more of these groups, where $R^1$ to $R^5$ each independently represent a hydrogen atom, a fluorine atom, or an alkyl group having 1 to 12 carbon atoms, provided that in a case where n1 is an integer of 2 to 4, a plurality of $X^1$s may be the same as or different from each other; in a case where m1 is an integer of 2 to 4, a plurality of $X^2$s may be the same as or different from each other; in a case where m2 is an integer of 2 to 4, a plurality of $X^5$s may be the same as or different from each other; and in a case where n2 is an integer of 2 to 4, a plurality of $X^6$s may be the same as or different from each other, $Ar^1$, $Ar^2$ and $Ar^3$ each independently represent an aromatic ring which may have a substituent, provided that in a case where n1 is an integer of 2 to 4, a plurality of $Ar^1$s may be the same as or different from each other; and in a case where n2 is an integer of 2 to 4, a plurality of $Ar^2$s may be the same as or different from each other, and $Cy^1$ and $Cy^2$ each independently represent an alicyclic ring which may have a substituent, provided that in a case where m1 is an integer of 2 to 4, a plurality of $Cy^1$s may be the same as or different from each other; and in a case where m2 is an integer of 2 to 4, a plurality of $Cy^2$s may be the same as or different from each other;

wherein the monofunctional compound is a compound represented by Formula (II), $$P^3\text{-}Sp^3\text{-}(X^1—Ar^4)_{n3}—(X^8\text{-}Cy^3)_{m3}\text{-}(X^9—Ar^5)_{n4}—X^{10}—Ar^6 \quad (II)$$

in Formula (II), $P^3$ represents an acryloyloxy group or a methacryloyloxy group, wherein $P^3$ includes a first terminal atom and $Ar^6$ includes a second terminal atom of the monofunctional compound represented by Formula (II), wherein the first terminal atom of the monofunctional compound represented by Formula (II) is a starting atom and the second terminal atom of the monofunctional compound represented by Formula (II) is an ending atom utilized to calculate a maximum number of atoms linked together at a shortest distance to form the monofunctional compound represented by Formula (II), wherein the maximum number of atoms linked together at a shortest distance to form the monofunctional compound represented by Formula (II) is counted such that the first terminal atom and the second terminal atom are also counted;

$Sp^3$ represents a single bond, a linear alkylene group having 1 to 14 carbon atoms, a branched alkylene group having 3 to 14 carbon atoms, or a divalent linking group in which one or more of $—CH_2$-s constituting the linear alkylene group or the branched alkylene group are substituted with —O—, —S—, —NH—, —N(Q)-, or —CO—, where Q represents a substituent, n3, n4, and m3 represent an integer from 0 to 2, and a sum of n3, n4, and m3 is 2, $X^7$, $X^8$, $X^9$, and $X^{10}$ each independently represent a single bond; or —CO—, —O—, —S—, —C(=S)—, —$CR^1R^2$—, —$CR^3$=$CR^4$—, —$NR^5$—, or a divalent linking group consisting of a combination of two or more of these groups, where $R^1$ to $R^5$ each independently represent a hydrogen atom, a fluorine atom, or an alkyl group having 1 to 12 carbon atoms, provided that in a case where n3 is 2 a plurality of $X^7$s may be the same as or different from each other; and in a case where m3 is 2, a plurality of $X^8$s may be the same as or different from each other, $Ar^4$ and $Ar^5$ each independently represent an aromatic ring which may have a substituent, provided that in a case where n3 and n4 are 2, a plurality of $Ar^4$s and $Ar^5$s may be the same as or different from each other, $Ar^6$ represents a benzene ring which does not have a substituent, and $Cy^3$ represents an alicyclic ring which may have a substituent, provided that in a case where m3 is 2, a plurality of $Cy^3$s may be the same as or different from each other;

wherein the polymerizable liquid crystal compound and the monofunctional compound satisfy a relationship of Expression (1), and satisfy a relationship of Expression (2), and wherein the optically anisotropic layer exhibits a smectic phase, $$0.2<a_2/a_1<0.55 \quad \text{Expression (1):}$$

$$b_2=b_1\times0.5 \text{ or } b_2=(b_1+1)\times0.5 \quad \text{Expression (2):}$$

wherein in Expression (1), $a_1$ is the maximum number of atoms linked together between the starting atom and the ending atom at the shortest distance to form the polymerizable liquid crystal compound represented by Formula (I), counted such that the starting atom and the ending atom are also counted; and $a_2$ is the maximum number of atoms linked together between the starting atom and the ending atom at the shortest distance to form the monofunctional compound represented by Formula (II), counted such that the starting atom and the ending atom are also counted, and wherein in Expression (2), $b_1$ is the number of substituted and unsubstituted aromatic rings present in $(X^1—Ar^1)_{n1}$, $Ar^3$, and $(Ar^2—X^6)_{n2}$, and the number of substituted and unsubstituted alicyclic rings present in $(X^2\text{-}Cy^1)_{m1}$, and $(Cy^2\text{-}X^5)_{m2}$ of Formula (I); and $b_2$ is the number of substituted and unsubstituted aromatic rings present in $(X^7—Ar^4)_{n3}$, $(X^9—Ar^5)_{n4}$, and $Ar^6$, and the number of substituted and unsubstituted alicyclic rings present in $(X^8\text{-}Cy^3)_{m3}$ of Formula (II).

2. The optically anisotropic layer according to claim 1, wherein n4 in Formula (II) is 0 and both of n3 and m3 in Formula (II) are the same as both n1 and m1 in Formula (I), respectively; or n4 in Formula (II) is 0 and both of n3 and m3 in Formula (II) are the same as both n2 and m2 in Formula (I), respectively.

3. The optically anisotropic layer according to claim 1, comprising at least one of the following:

i) wherein both of n1 and n3 represent 2, n4 represents 0, and the partial structure represented by "$Ar^1—(X^1—Ar^1)—(X^2\text{-}Cy^1)_{m1}\text{-}X^3$" in Formula (I) is the same as the partial structure represented by "$Ar^4—(X^7—Ar^4)—(X^8\text{-}Cy^3)_{m3}\text{-}X^{10}$" in Formula (II);

ii) wherein both of n1 and n3 represent 1, n4 represents 0, and the partial structure represented by "$Ar^1—(X^2\text{-}Cy^1)_{m1}\text{-}X^3$" in Formula (I) is the same as the partial structure represented by "$Ar^4—(X^8\text{-}Cy^3)_{m3}\text{-}X^{10}$" in Formula (II);

iii) wherein both of n1 and n3 represent 0, both of m1 and m3 represent 2, n4 represents 0, and the partial structure represented by "$Cy^1\text{-}(X^2\text{-}Cy^1)—X^3$" in Formula (I) is the same as the partial structure represented by "$Cy^3\text{-}(X^8\text{-}Cy^3)—X^{10}$" in Formula (II);

iv) wherein both of n1 and n3 represent 0, both of m1 and m3 represent 1, n4 represents 0, and the partial structure represented by "$Cy^1\text{-}X^3$" in Formula (I) is the same as the partial structure represented by "$Cy^3\text{-}X^{10}$" in Formula (II);

v) wherein both of n2 and n3 represent 2, n4 represents 0, and the partial structure represented by "$X^4—(Cy^2\text{-}X^5)_{m2}—(Ar^2—X^6)—Ar^2$" in Formula (I) is the same as the partial structure represented by "$Ar^4—(X^7—Ar^4)—(X^8\text{-}Cy^3)_{m3}\text{-}X^{10}$" in Formula (II);

vi) wherein both of n2 and n3 represent 1, n4 represents 0, and the partial structure represented by "$X^4—(Cy^2\text{-}X^5)_{m2}—Ar^2$" in Formula (I) is the same as the partial structure represented by "$Ar^4—(X^8\text{-}Cy^3)_{m3}\text{-}X^{10}$" in Formula (II);

vii) wherein both of n2 and n3 represent 0, both of m2 and m3 represent 2, n4 represents 0, and the partial structure represented by "$X^4—(Cy^2\text{-}X^5)\text{-}Cy^2$" in Formula (I) is the same as the partial structure represented by "$Cy^3\text{-}(X^8\text{-}Cy^3)—X^{10}$" in Formula (II); and viii) wherein both of n2 and n3 represent 0, both of m2 and m3 represent 1, n4 represents 0, and the partial structure represented by "$X^4\text{-}Cy^2$" in Formula (I) is the same as the partial structure represented by "$Cy^3\text{-}X^{10}$" in Formula (II).

4. The optically anisotropic layer according to claim 1, wherein a sum of n1 and m1 is 2, and a sum of m2 and n2 is 2 in Formula (I).

5. The optically anisotropic layer according to claim 1, wherein the aromatic ring represented by $Ar^3$ in Formula (I) has the number of π electrons of 10 or more.

6. The optically anisotropic layer according to claim 1, wherein $Ar^3$ in Formula (I) is a group represented by Formula (III), (III)

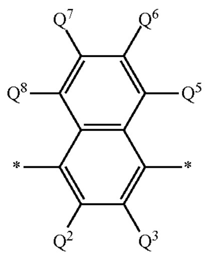

in Formula (III), $Q^2$, $Q^3$, $Q^5$, $Q^6$, $Q^7$, and $Q^8$ each independently represent a hydrogen atom or a substituent, and one of two * represents a bonding position to $X^3$, and the other represents a bonding position to $X^4$.

7. The optically anisotropic layer according to claim 1, wherein in Formula (I), all of n1, m1, m2, and n2 are 1.

8. The optically anisotropic layer according to claim 1, wherein in Formula (I), both of n1 and n2 are 0, and both of m1 and m2 are 2.

9. The optically anisotropic layer according to claim 1, wherein at least one of the alicyclic rings $Cy^1$ and $Cy^2$ in Formula (I) is 1,4-cyclohexylene group.

10. The optically anisotropic layer according to claim 1, wherein at least one of the alicyclic rings $Cy^3$ in Formula (II) is 1,4-cyclohexylene group.

11. The optically anisotropic layer according to claim 1, wherein the polymerizable liquid crystal compound and the monofunctional compound satisfy a relationship of Expression (1a), $$0.35<a_2/a_1<0.53 \qquad \text{Expression (1a):}$$

$a_1$ and $a_2$ in Expression (1a) are the same as $a_1$ and $a_2$ in the Expression (1), respectively.

12. The optically anisotropic layer according to claim 1, wherein the optically anisotropic layer has one surface and another surface, and wherein the polymerizable liquid crystal compound is in a state of being horizontally aligned with respect to the one surface of the optically anisotropic layer.

13. The optically anisotropic layer according to claim 1, wherein the optically anisotropic layer is a positive A plate.

14. An optical film comprising the optically anisotropic layer according to claim 1.

15. The optical film according to claim 14, wherein the optically anisotropic layer is formed on a surface of a photo-alignment film.

16. A polarizing plate comprising:

the optical film according to claim 14; and a polarizer.

17. An image display device comprising the polarizing plate according to claim 16.

18. The image display device according to claim 17, wherein the image display device is a liquid crystal display device.

19. The image display device according to claim 17, wherein the image display device is an organic EL display device.

20. The optically anisotropic layer according to claim 1, wherein the aromatic ring represented by $Ar^3$ in Formula (I) is an aromatic ring selected from the group consisting of an aromatic hydrocarbon ring a pyridine ring, a quinoline ring, an isoquinoline ring, a quinoxaline ring, and a quinazoline ring.

21. The optically anisotropic layer according to claim 1, wherein m3 is 1 or 2 in Formula (II).

* * * * *